United States Patent [19]
Kolze

[11] Patent Number: 5,825,200
[45] Date of Patent: Oct. 20, 1998

[54] PROGRAMMING ARCHITECTURE FOR A PROGRAMMABLE INTEGRATED CIRCUIT EMPLOYING ANTIFUSES

[75] Inventor: Paige A. Kolze, San Jose, Calif.

[73] Assignee: QuickLogic Corporation, Sunnyvale, Calif.

[21] Appl. No.: 929,655

[22] Filed: Sep. 17, 1997

Related U.S. Application Data

[62] Division of Ser. No. 667,702, Jun. 21, 1996.

[51] Int. Cl.$^6$ ............................................. H03K 19/177
[52] U.S. Cl. ............................................. 326/38; 326/41
[58] Field of Search ........................................ 326/38–41

[56] References Cited

U.S. PATENT DOCUMENTS

| | | | |
|---|---|---|---|
| 4,439,804 | 3/1984 | Riddle et al. | 361/92 |
| 5,053,909 | 10/1991 | Suzuki et al. | 326/102 |
| 5,132,563 | 7/1992 | Fujii et al. | 326/103 |
| 5,196,724 | 3/1993 | Gordon et al. | 257/530 |
| 5,220,213 | 6/1993 | Chan et al. | |
| 5,302,546 | 4/1994 | Gordon et al. | 437/170 |
| 5,327,024 | 7/1994 | Cox | 307/465 |
| 5,336,986 | 8/1994 | Allman | 323/268 |
| 5,341,030 | 8/1994 | Galbraith | 326/38 |
| 5,347,519 | 9/1994 | Cooke et al. | 371/22.2 |
| 5,367,207 | 11/1994 | Goetting et al. | 307/465 |
| 5,391,942 | 2/1995 | El-Ayat et al. | 326/39 |
| 5,416,367 | 5/1995 | Chan et al. | 326/44 |
| 5,424,655 | 6/1995 | Chua | 326/40 |
| 5,477,167 | 12/1995 | Chua | 326/41 |
| 5,479,113 | 12/1995 | Gamal | 326/38 |
| 5,495,181 | 2/1996 | Kolze | 326/38 |
| 5,502,315 | 3/1996 | Chua et al. | 257/50 |
| 5,534,793 | 7/1996 | Nasserbakht | 326/44 |
| 5,537,056 | 7/1996 | McCollum | 326/38 |
| 5,544,070 | 8/1996 | Cox et al. | 364/489 |
| 5,557,136 | 9/1996 | Gordon et al. | 257/530 |
| 5,594,361 | 1/1997 | Campbell | 326/83 |
| 5,654,649 | 8/1997 | Chua | 326/16 |

OTHER PUBLICATIONS

Advanced Micro Devices, PAL Devices Book and Design Guide, pp. 2–236 through 2–247 (1993). month unknown.
QuickLogic, Data Book, pp.1–5 through 2–11 and 6–3 through 6–18 (1995). month unknown.
Actel, FPGA Data Book and Design Guide, pp. ix–xv, 1–5 through 1–34, 1–51 through 1–101, 1–153 through 1–222, 3–1 through 4–56 (1995). month unknown.
Xilinx, "The Programmable Gate Array Design Hand Book", First Edition, pp. 1–9 through 2–73 (1986). month unknown.
S. Brown, et al., "Field Programmable Gate Arrays", pp. 1–43 and 88–202 (1992). month unknown.
S. Trimberger, "Field Programmable Gate Array Technology", pp.1–14 and 98–170 (1994). month unknown.
D. Pellerin, et al., "Practical Design Using Programmable Logic", pp. 84–98 (1991). month unknown.

*Primary Examiner*—Jon Santamauro
*Assistant Examiner*—Don Phu Le
*Attorney, Agent, or Firm*—Skjerven, Morrill,MacPherson, Franklin and Friel; T. Lester Wallace

[57] ABSTRACT

The programmable interconnect structure of a field programmable gate array (see FIG. 4B) includes a plurality of wire segments extending in a first direction, the wire segments being collinear with respect to each other. An antifuse is disposed between each pair of adjacent wire segments so that the adjacent wire segments can be coupled together. Programming conductors for supplying a programming voltage onto selected wire segments extend in a second direction perpendicular to the first direction. The programming drivers for driving some of the programming conductors are disposed on one side (for example above) of the wire segments whereas the programming drivers for driving others of the programming conductors are disposed on the opposite side (for example below) of the wire segments. The pattern for programming drivers coupled to programming conductors alternates from one side of the wire segments to the other from column to column across the field programmable gate array.

4 Claims, 39 Drawing Sheets

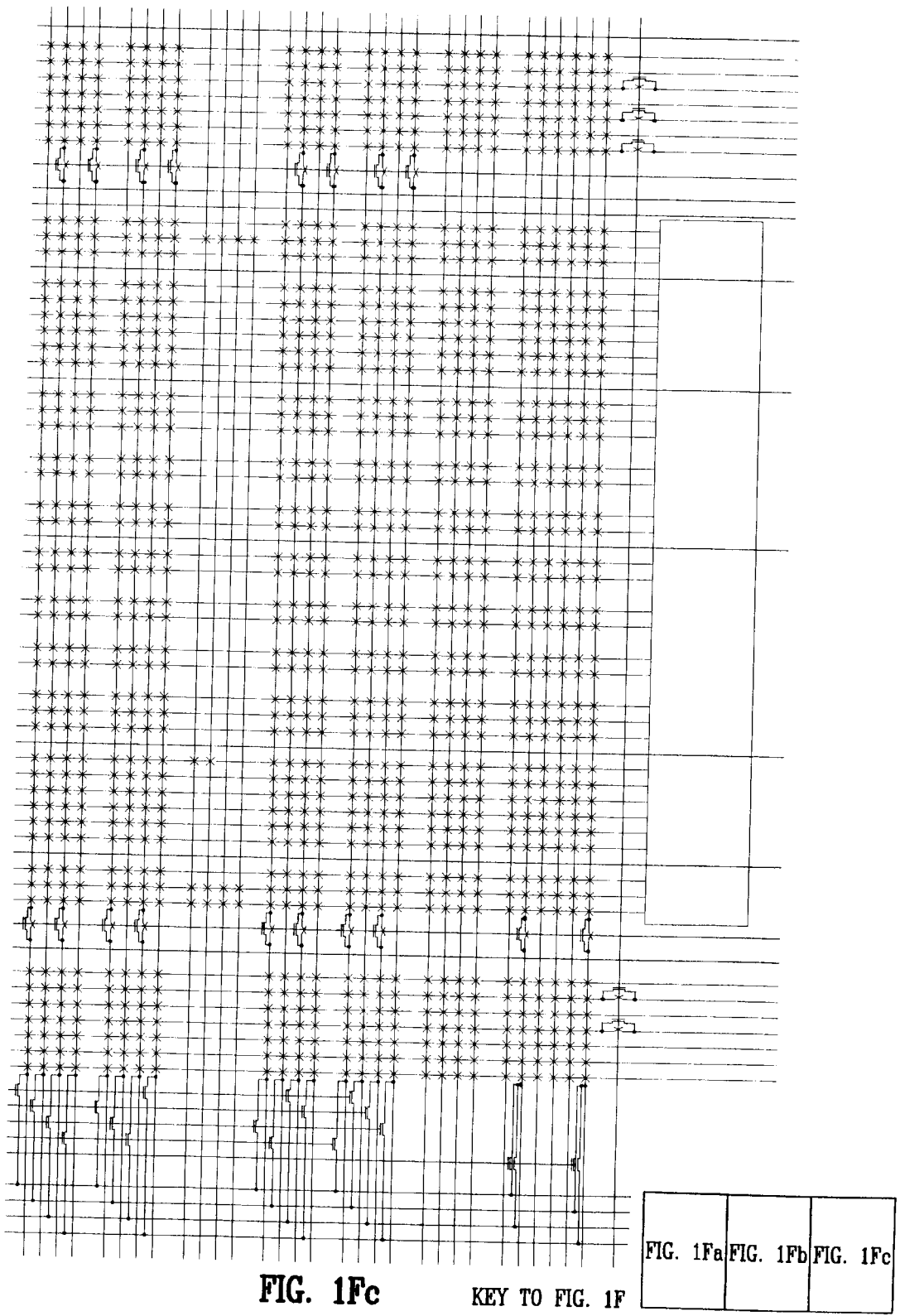
FIG. 1Fc     KEY TO FIG. 1F
| FIG. 1Fa | FIG. 1Fb | FIG. 1Fc |

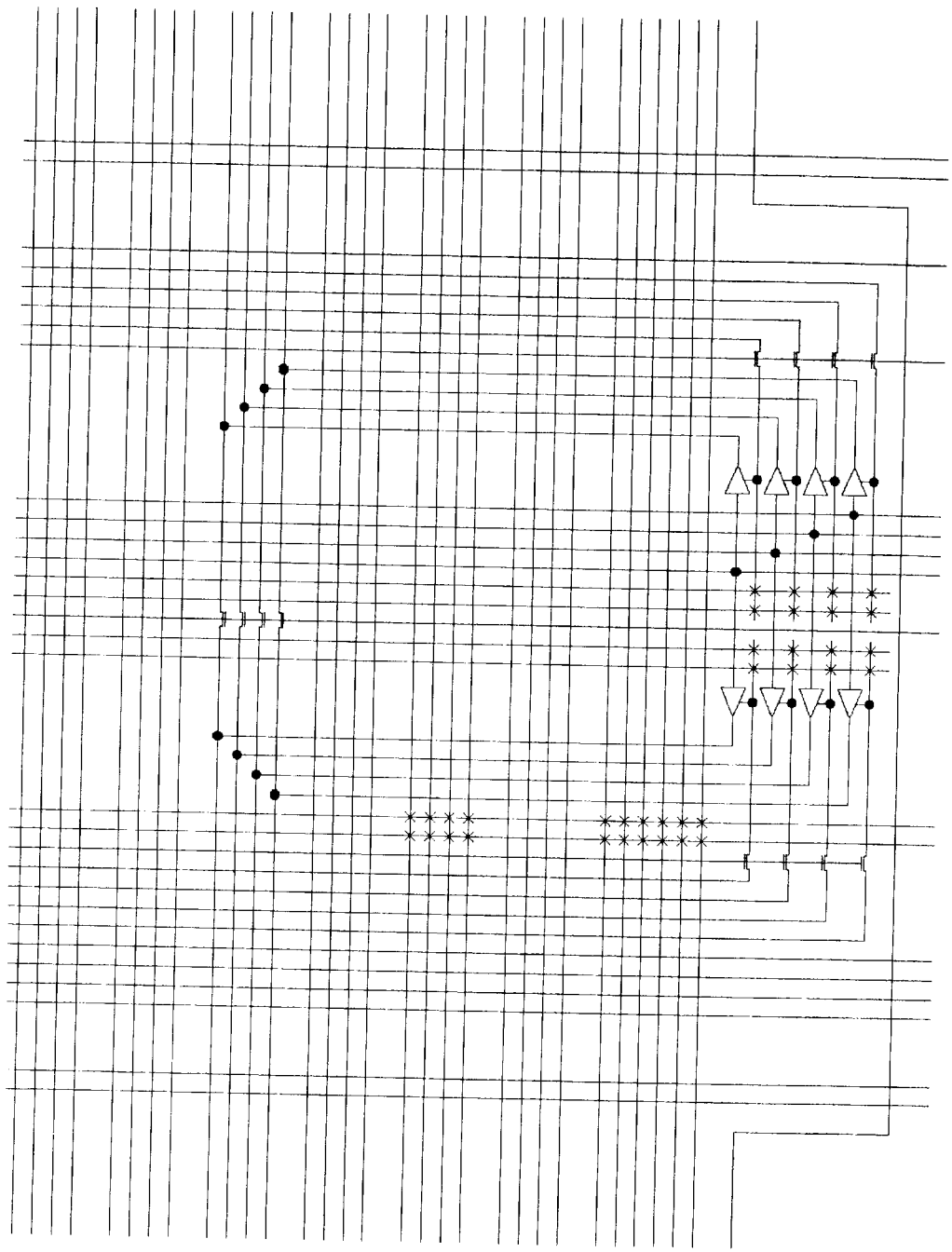
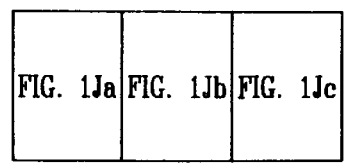
FIG. 1Jc  KEY TO FIG. 1J

PROGRAMMING ARCHITECTURE FOR A PROGRAMMABLE INTEGRATED CIRCUIT EMPLOYING ANTIFUSES

This application is a division of application Ser. No. 08/667,702, filed Jun. 21, 1996, now pending.

MICROFICHE APPENDIX

The microfiche appendix, which is part of the present disclosure, consists of 3 sheets of microfiche having a total of 189 frames. A portion of the disclosure of this patent document contains material which is subject to copyright protection. The copyright owner has no objection to the facsimile reproduction by anyone of the patent documents or patent disclosure, as it appears in the Patent and Trademark Office patent files or records, but otherwise reserves all copyright rights.

FIELD OF THE INVENTION

This invention relates to programmable integrated circuits employing antifuses. More particularly, this invention relates to field programmable gate arrays (FPGAs) employing antifuses.

BACKGROUND INFORMATION

A programmable application specific integrated circuit (ASIC) is a versatile integrated circuit chip, the internal circuitry of which may be configured by an individual user to realize a user-specific circuit. To configure a programmable ASIC, the user configures an on-chip interconnect structure of the programmable ASIC so that selected input terminals and selected output terminals of selected on-chip circuit components are electrically connected together in such a way that the resulting circuit is the user-specific circuit desired by the user. In a programmable ASIC employing, for example, amorphous silicon antifuses, selected amorphous silicon antifuses disposed between selected wire segments are "programmed" to connect the selected wire segments together electrically. Which antifuses are programmed and which antifuses are left unprogrammed determines how the circuit components are interconnected and therefore determines the resulting circuit.

A field programmable gate array (an "FPGA") is one type of programmable application specific integrated circuit. For background information on field programmable gate arrays employing antifuses, see: "Field Programmable Gate Array Technology" edited by Stephen Trimberger, 1994, pages 1-14 and 98-170; "Field-Programmable Gate Arrays" by Stephen Brown et al., 1992, pages 1-43 and 88-202; "Practical Design Using Programmable Logic" by David Pellerin and Michael Holley, 1991, pages 84-98; the 1995 QuickLogic Data Book, 1995, pages 1-5 through 2-11 and 6-3 through 6-18; the 1995 Actel FPGA Data Book And Design Guide, 1995, pages ix-xv, 1-5 through 1-34, 1-51 through 1-101, 1-153 through 1-222, 3-1 through 4-56; U.S. Pat. No. 5,424,655 entitled "Programmable Application Specific Integrated Circuit Employing Antifuses And Methods Therefor". The contents of these documents is incorporated herein by reference.

SUMMARY

A programming architecture for a programmable integrated circuit employing antifuses is disclosed. In on aspect, the number of programming conductors and the number of perpendicular programming control conductors for a module are substantially equal in a particular macrocell architecture. In another aspect, programming current is supplied onto a long routing wire segment from two different programming conductors via two programming transistors. In another aspect, a pattern of programming drivers alternates from one side of the integrated circuit to another from one column of macrocells to the next. In other aspects, control conductors and programming conductors are tested with test antifuses and test transistors. In another aspect, adjacent logic modules are mirrored so that they can share an intervening programming conductor resource. In another aspect, L-shaped programming power busses are provided and in another aspect, an express wire is simultaneously driven with programming current from two different programming voltage terminals. In another aspect, a test circuit is provided for testing the integrity of collinear routing wire segments in an unprogrammed programmable integrated circuit. In another aspect, programming transistors on the outputs of logic modules are tested. In another aspect, techniques and structures are disclosed for programming antifuses in interface cells that are disposed on branches of clock conductors.

This summary does not purport to define the invention. The invention is defined by the claims.

DETAILED DESCRIPTION OF THE PREFERRED EMBODIMENTS

Figures 1, 2:
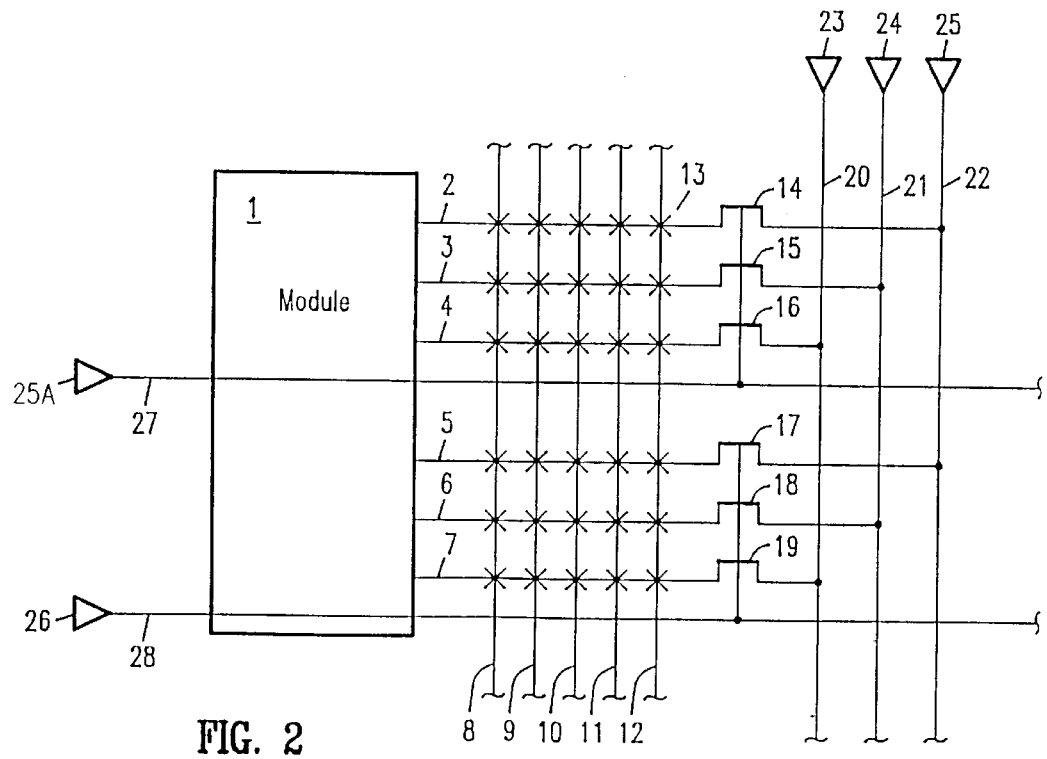
FIG. 1 is a diagram showing how FIGS. 1A, 1Ba, 1Bb, 1Bc, 1C, 1D, 1E, 1Fa, 1Fb, 1Fc, 1G, 1H, 1I, 1Ja, 1Jb, 1Jc, 1K, 1L, 1M, 1Na, 1Nb, 1Nc, 10 and 1P fit together to form one large simplified schematic of one embodiment of a programming structure of a programmable integrated circuit employing antifuses.
FIG. 2 is a simplified diagram illustrating a first aspect in accordance with the embodiment of FIG. 1.
Figure 1A:
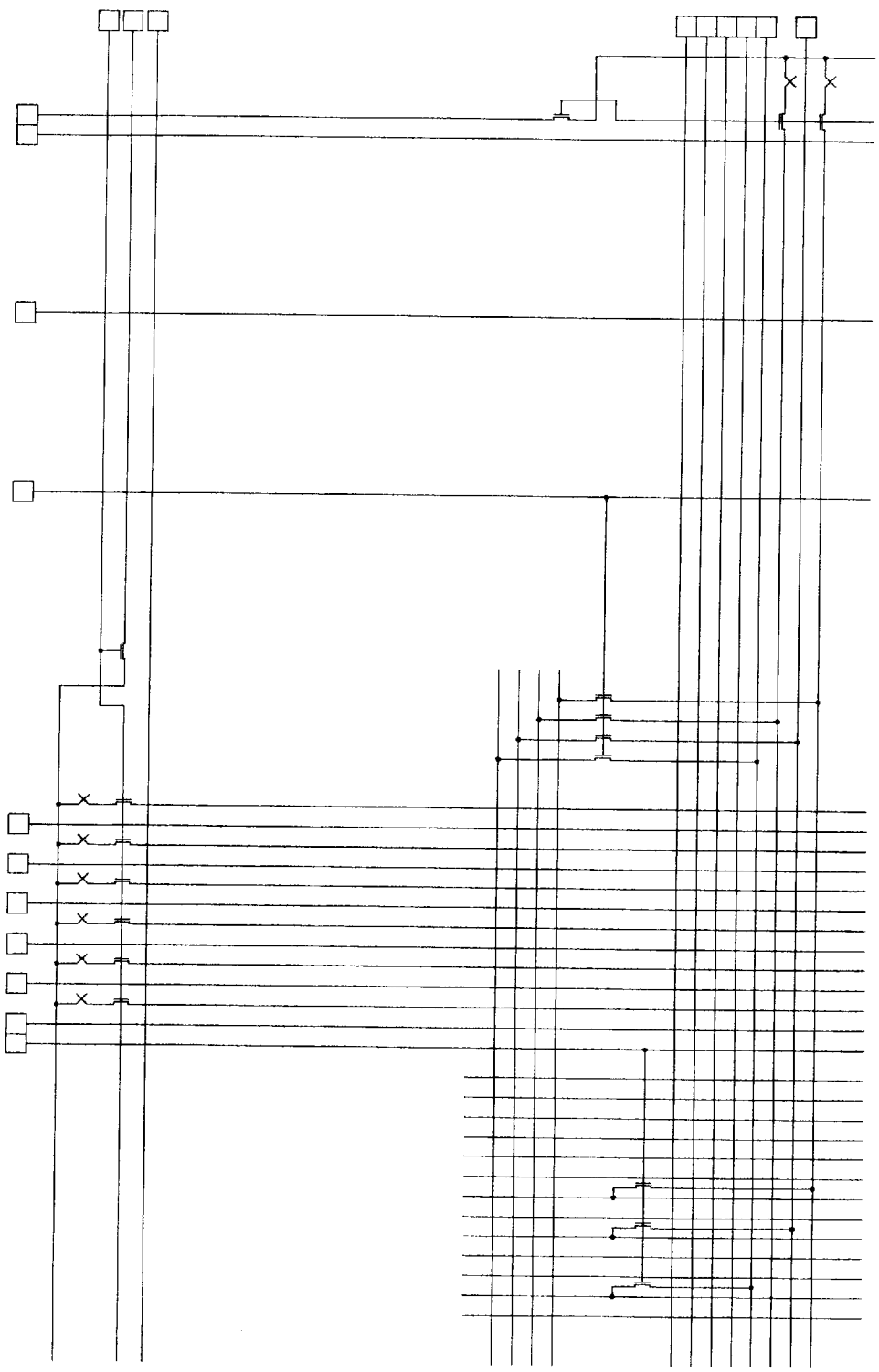
Figure 1B:
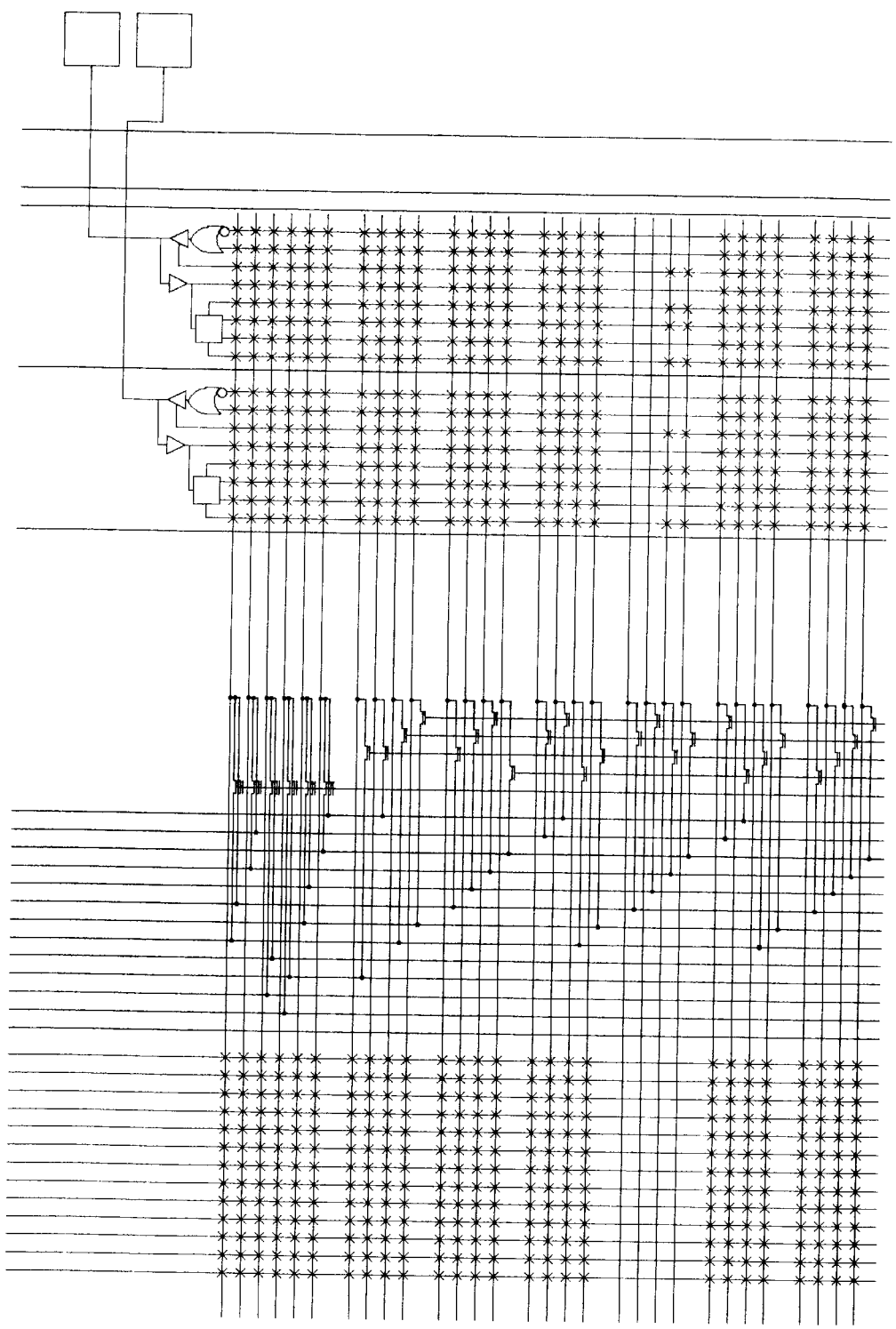
Figure 1B:
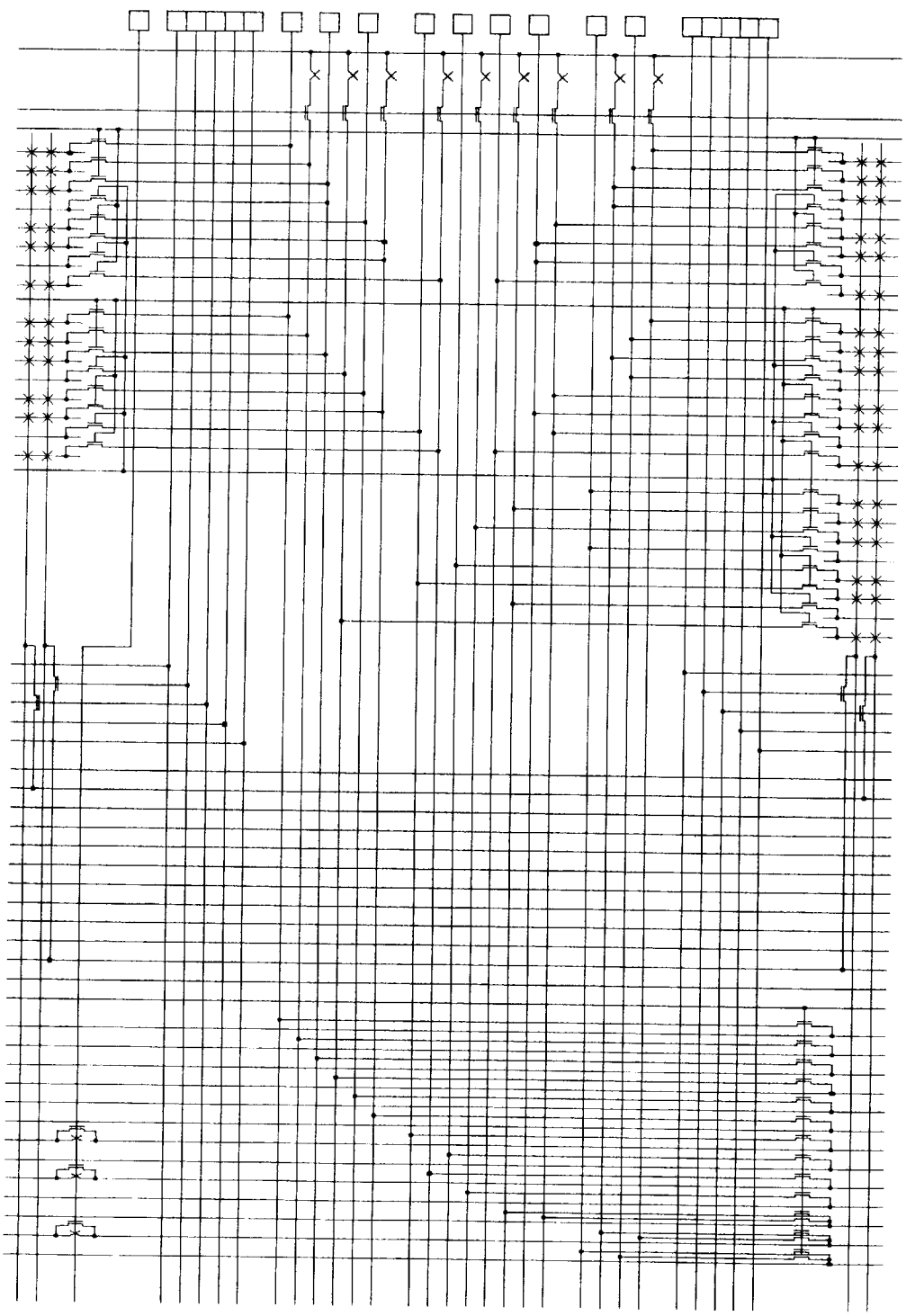
Figure 1B:
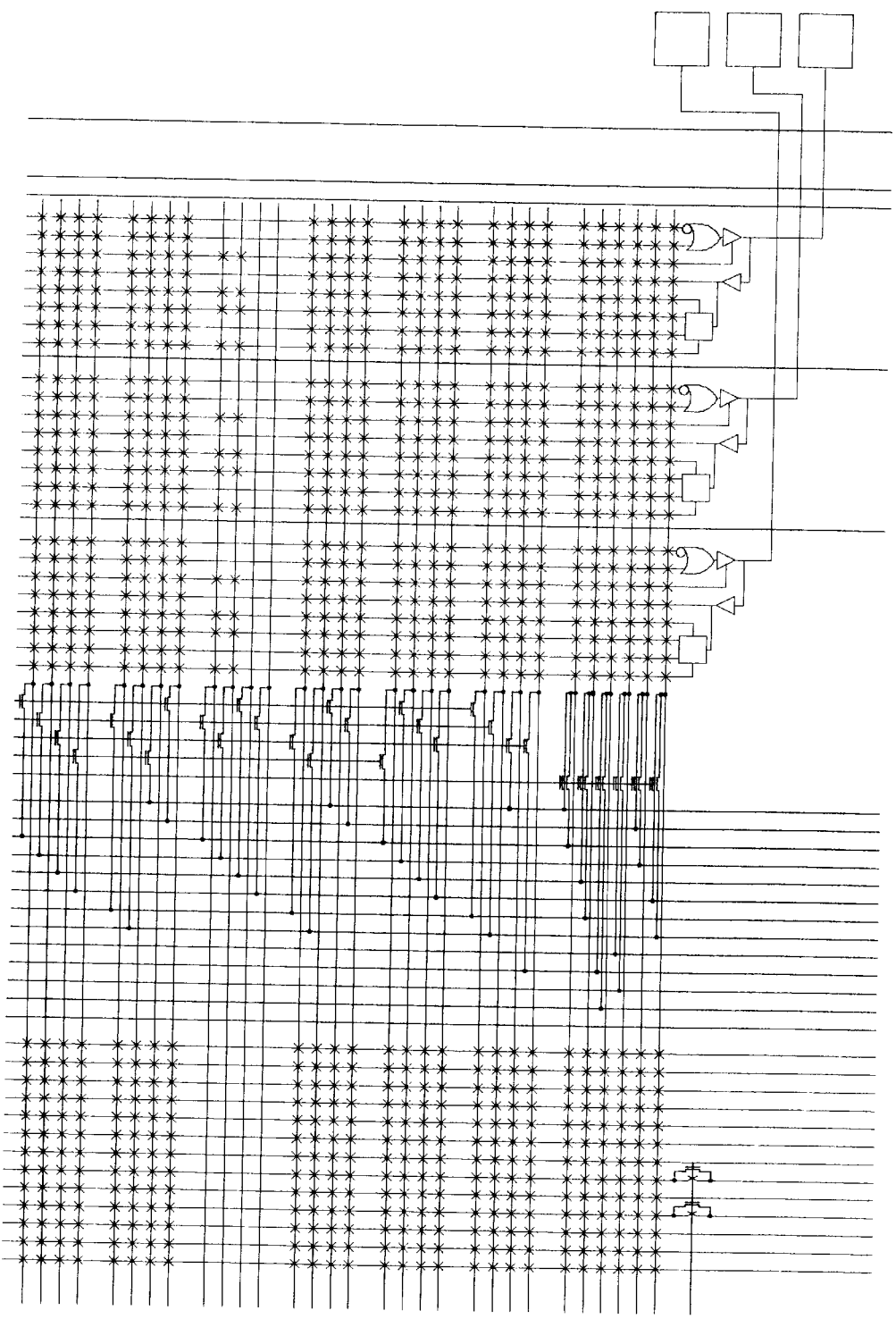

FIG. 1 is a diagram showing how FIGS. 1A, 1Ba, 1Bb, 1Bc, 1C, 1D, 1E, 1Fa, 1Fb, 1Fc, 1G, 1H, 1I, 1Ja, 1Jb, 1Jc, 1K, 1L, 1M, 1Na, 1Nb, 1Nc, 1O and 1P fit together to form one large simplified schematic of one embodiment of a programming structure of a programmable integrated circuit employing antifuses. The boxes of FIG. 1 each have a letter to indicate one of the FIGS. 1A–1P. The "A" in the upper left box, for example, indicates FIG. 1A. As is seen from FIG. 1, the structure of FIG. 1A borders FIG. 1B on the right and the structure of FIG. 1E on the bottom.

Figure 1C:
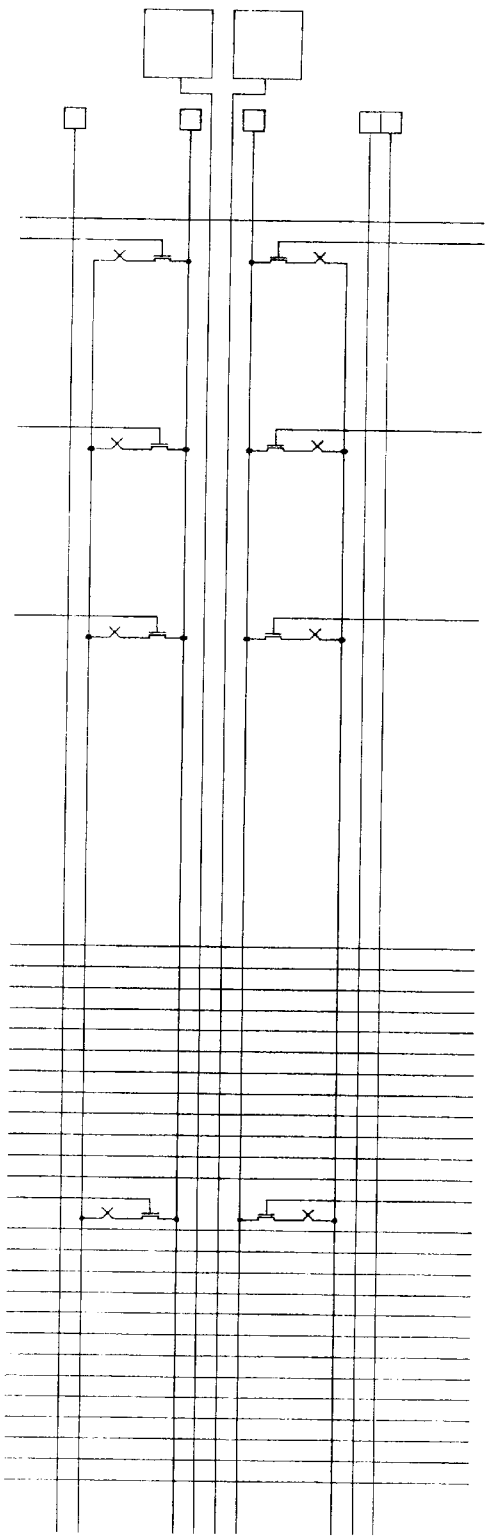
Figure 1D:
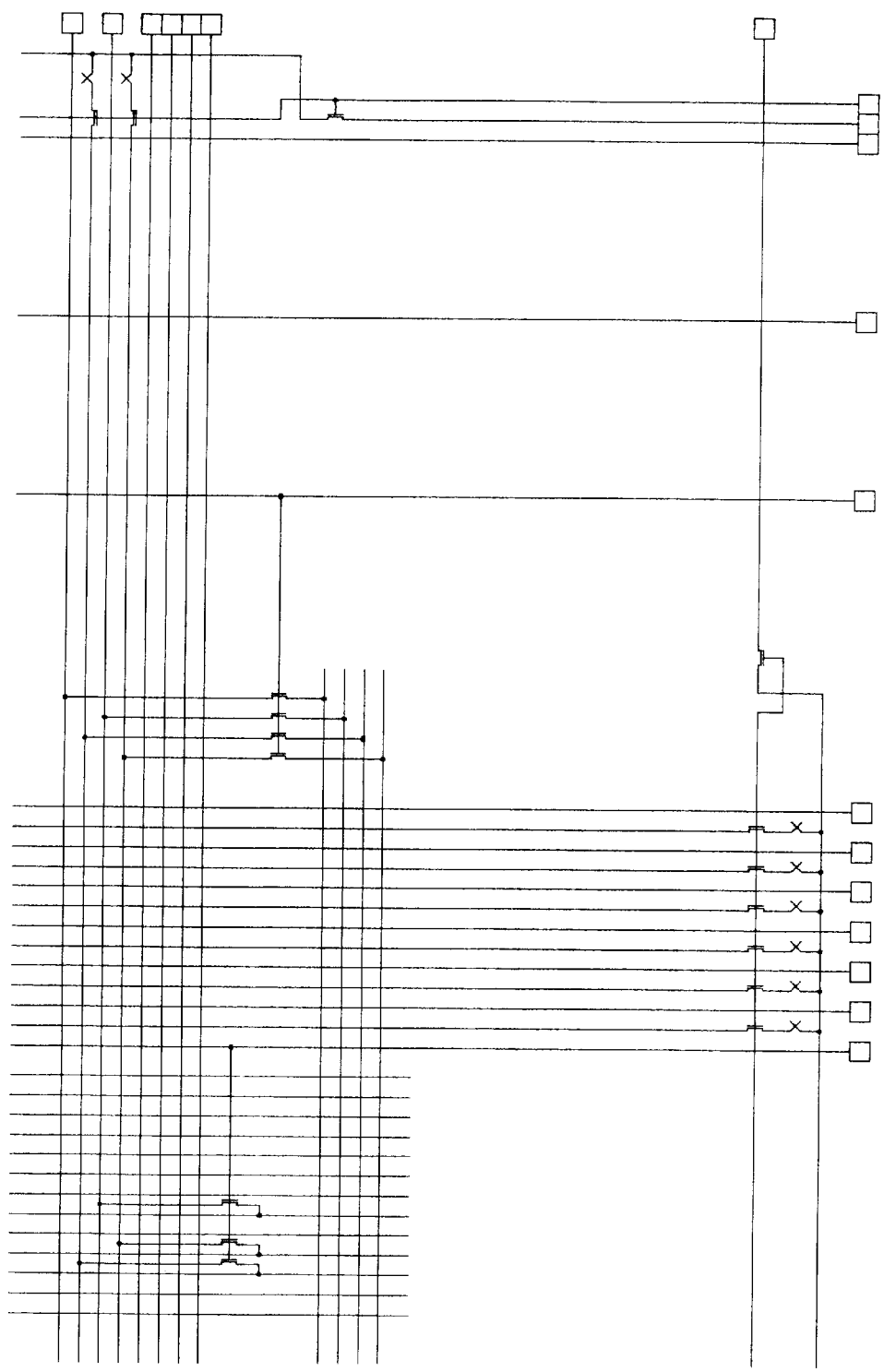
Figure 1E:
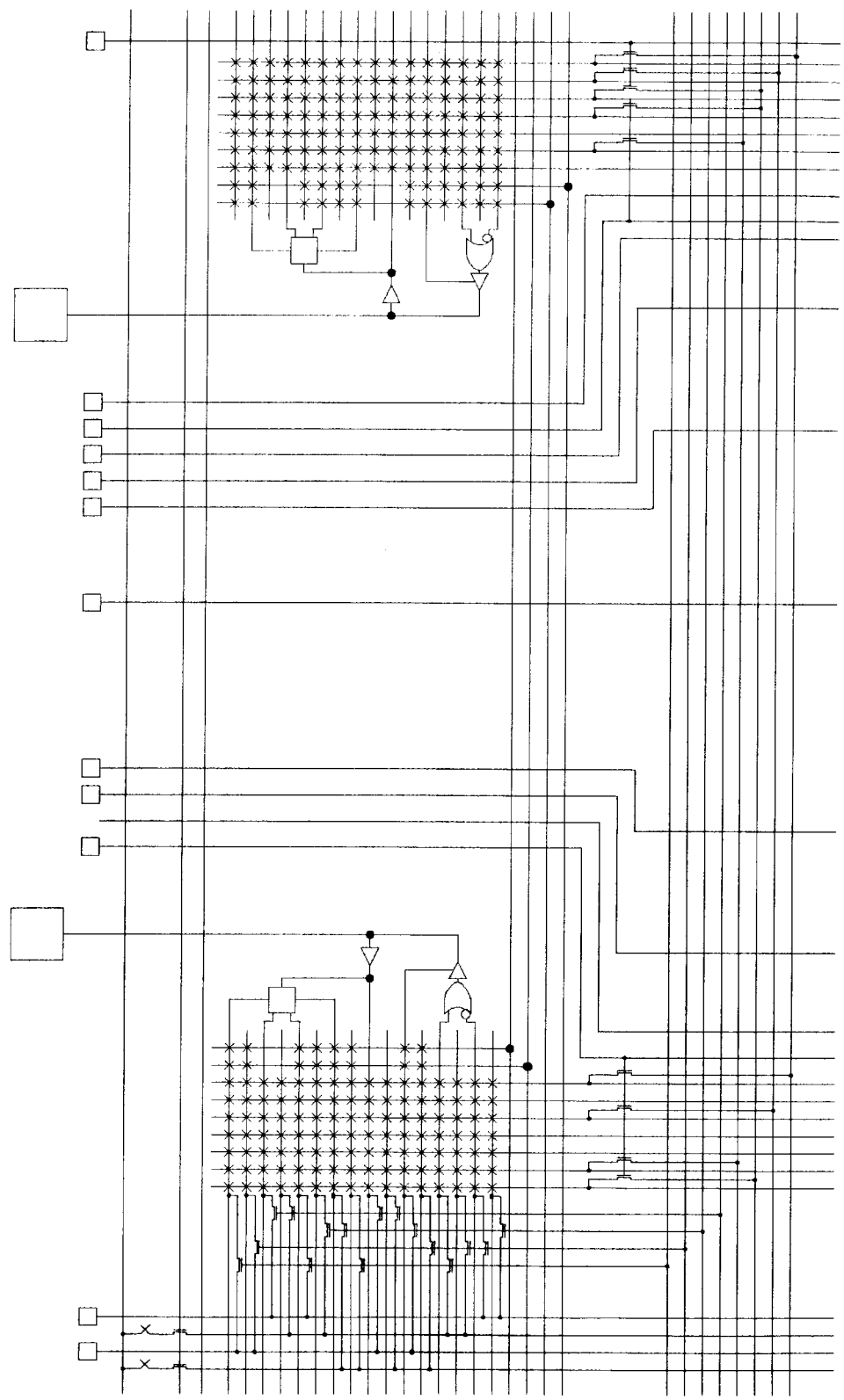
Figure 1F:
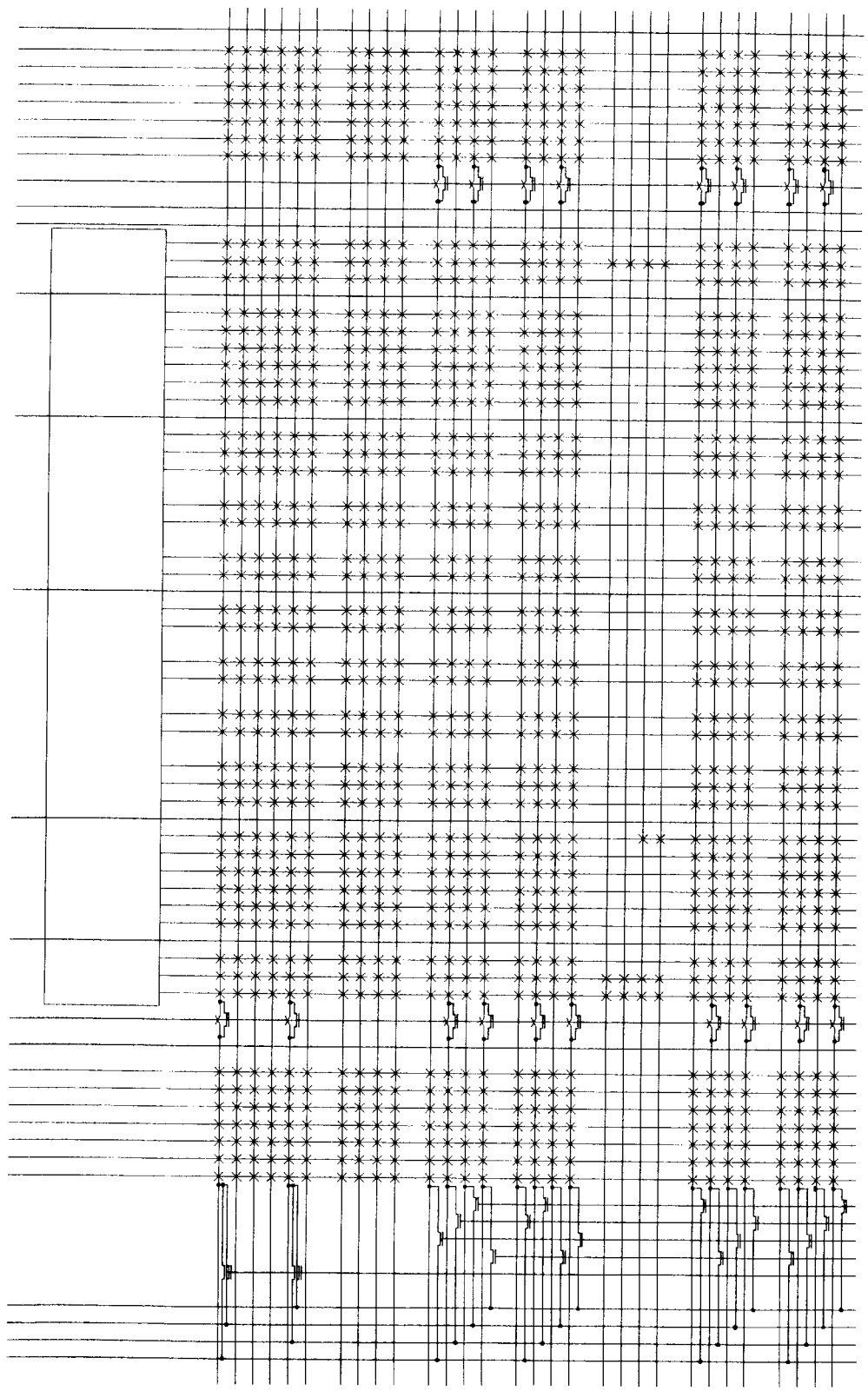
Figure 1F:
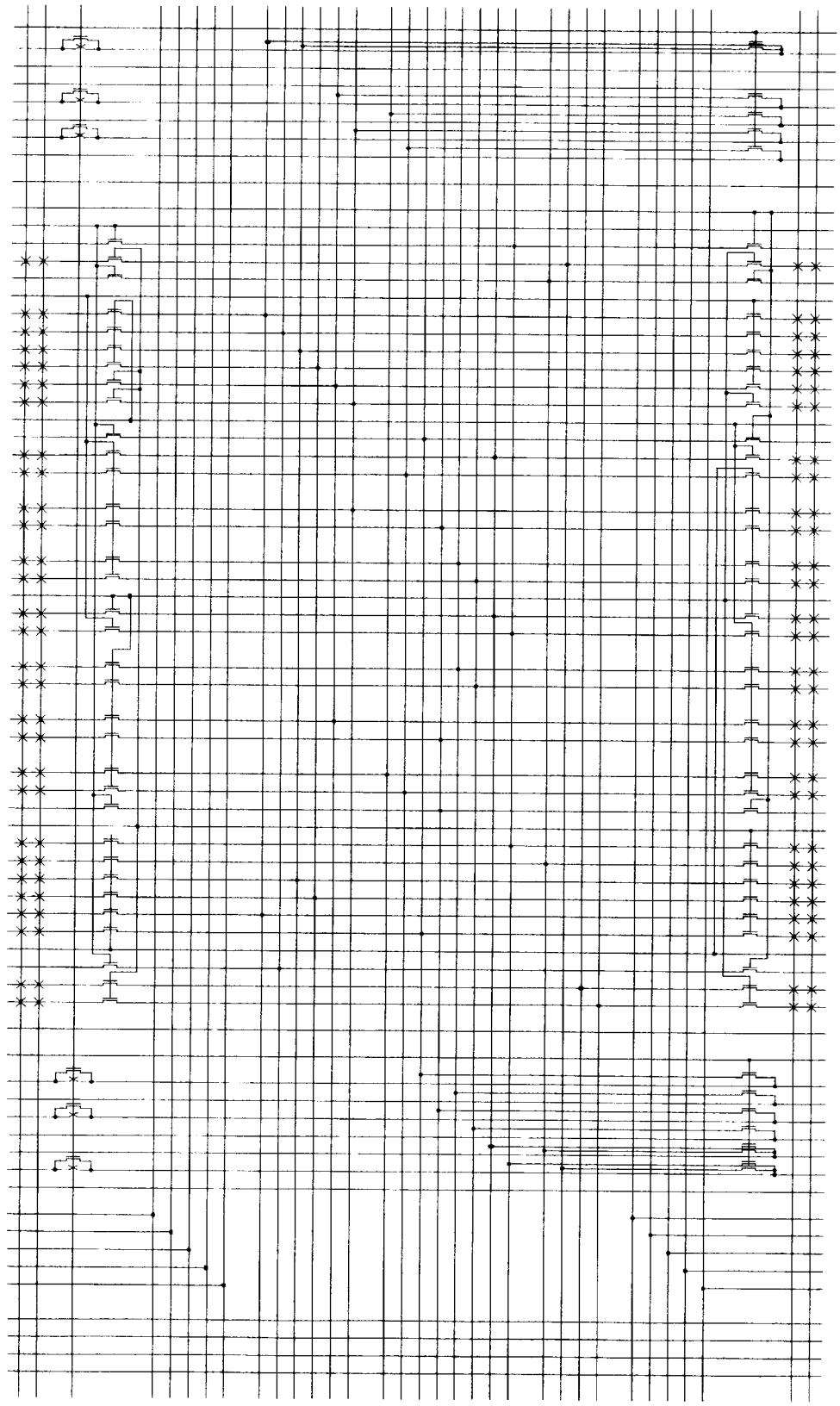
Figure 1G:
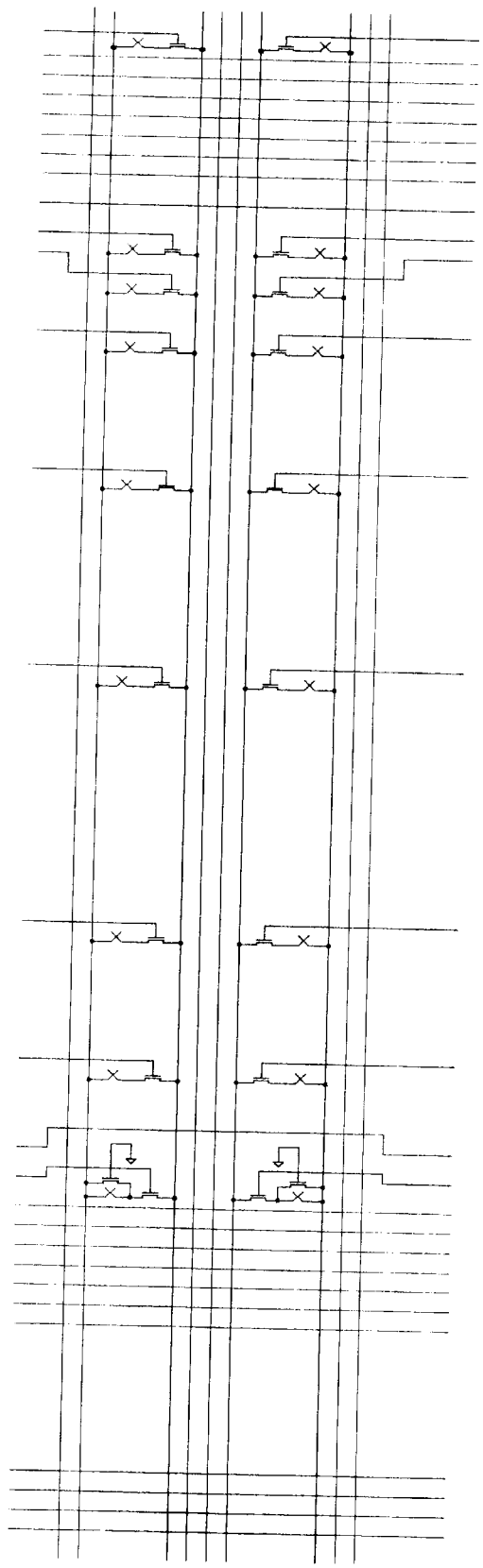
Figure 1H:
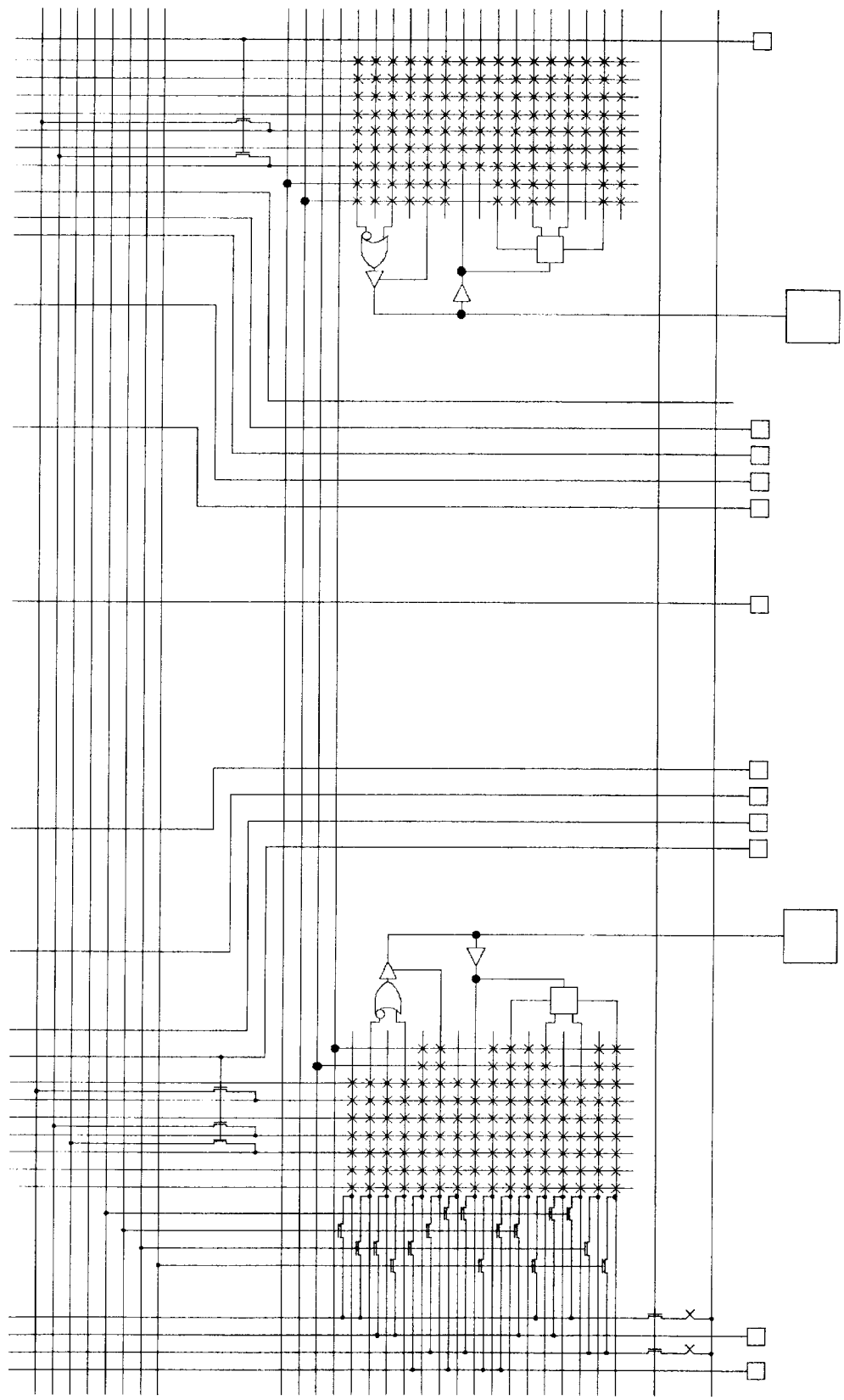
Figure 1I:
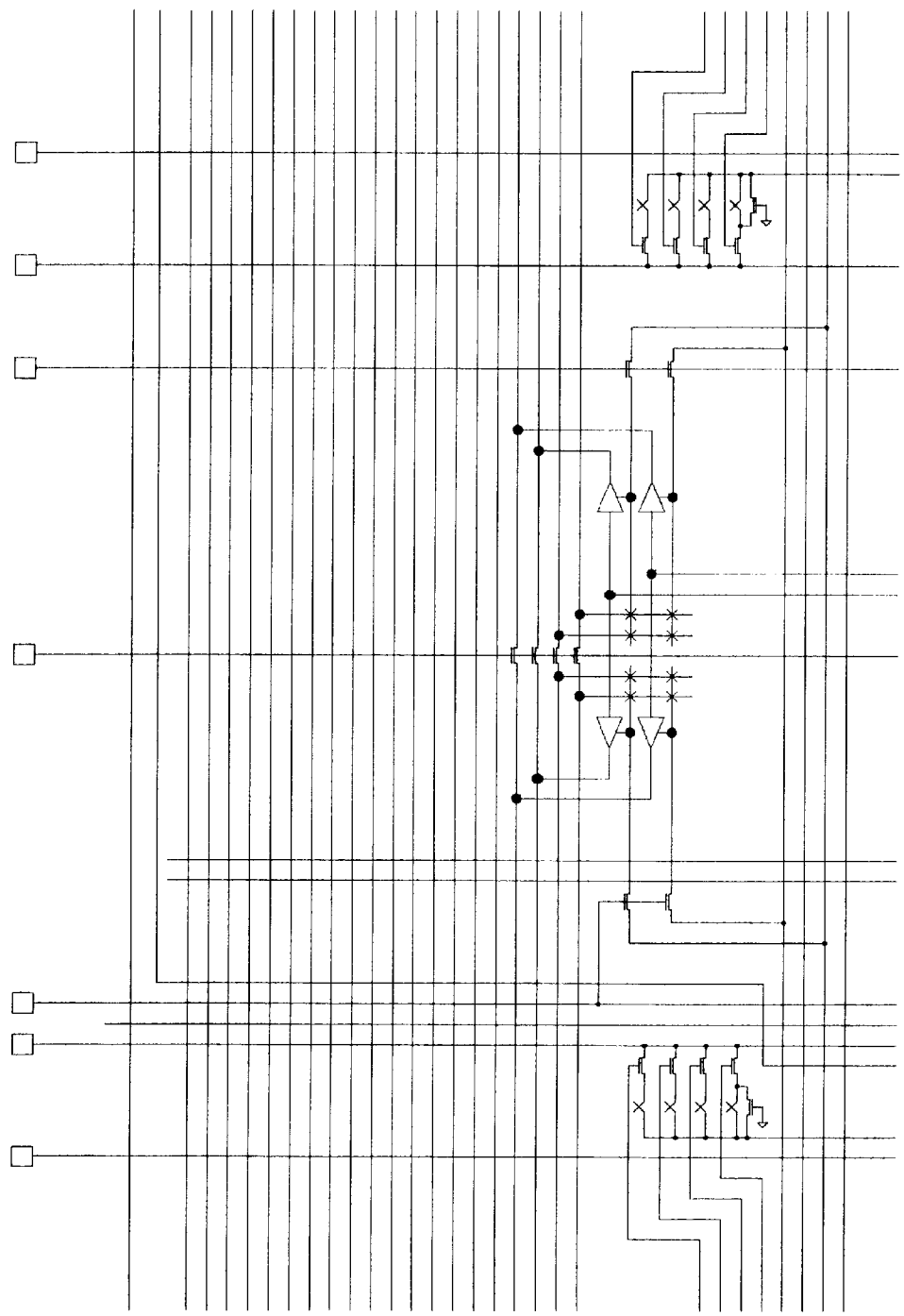
Figure 1J:
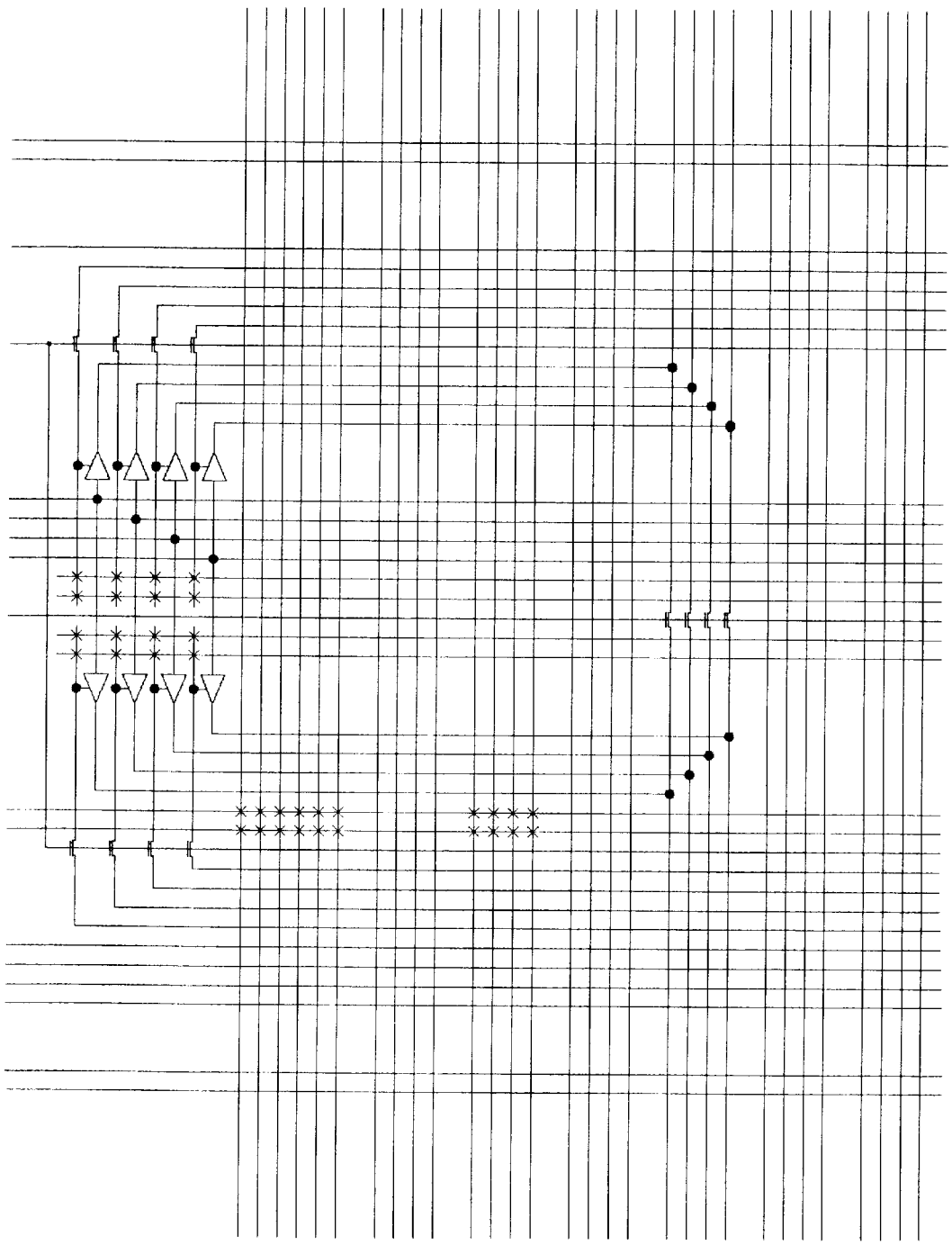
Figure 1J:
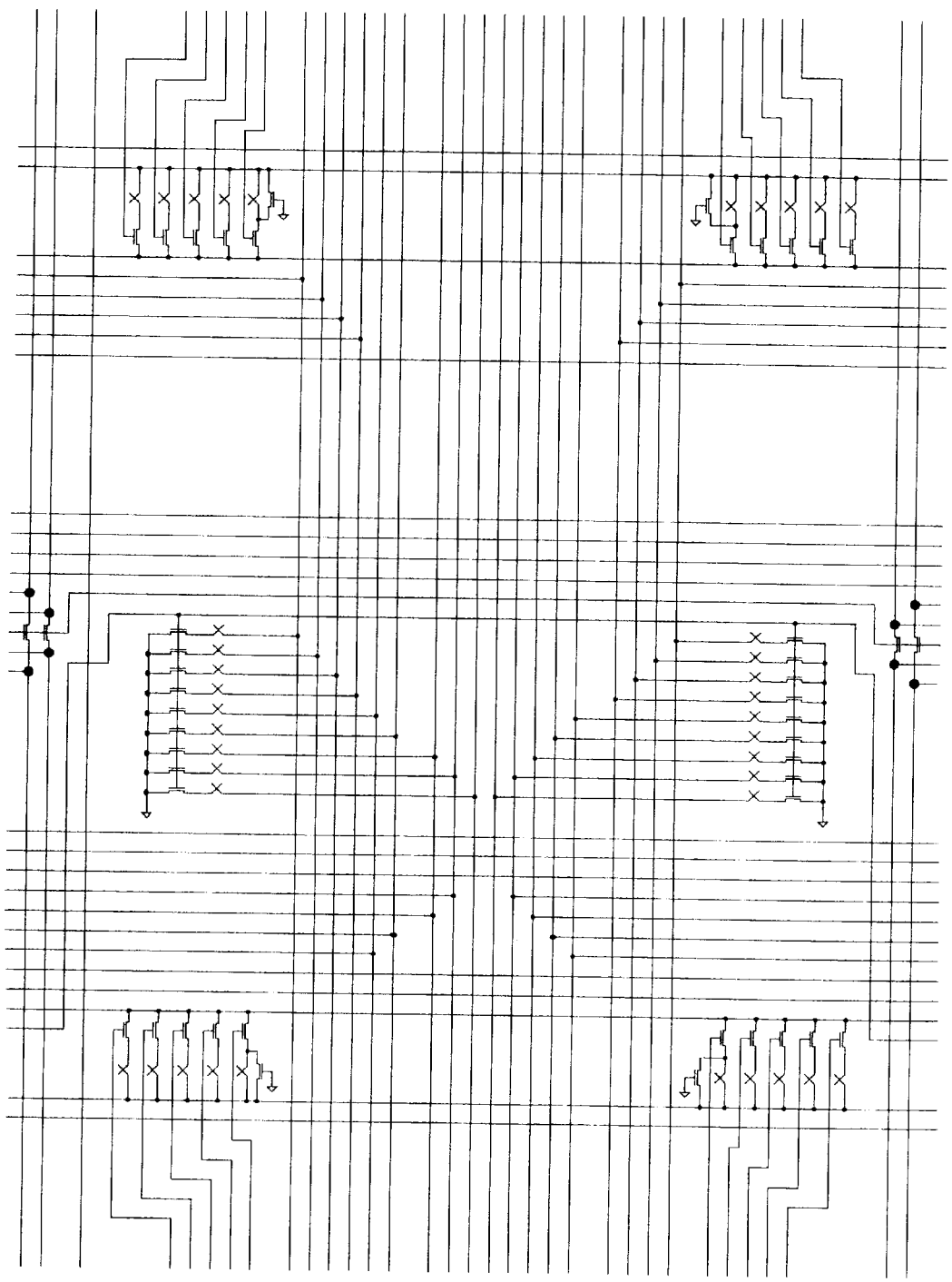
Figure 1K:
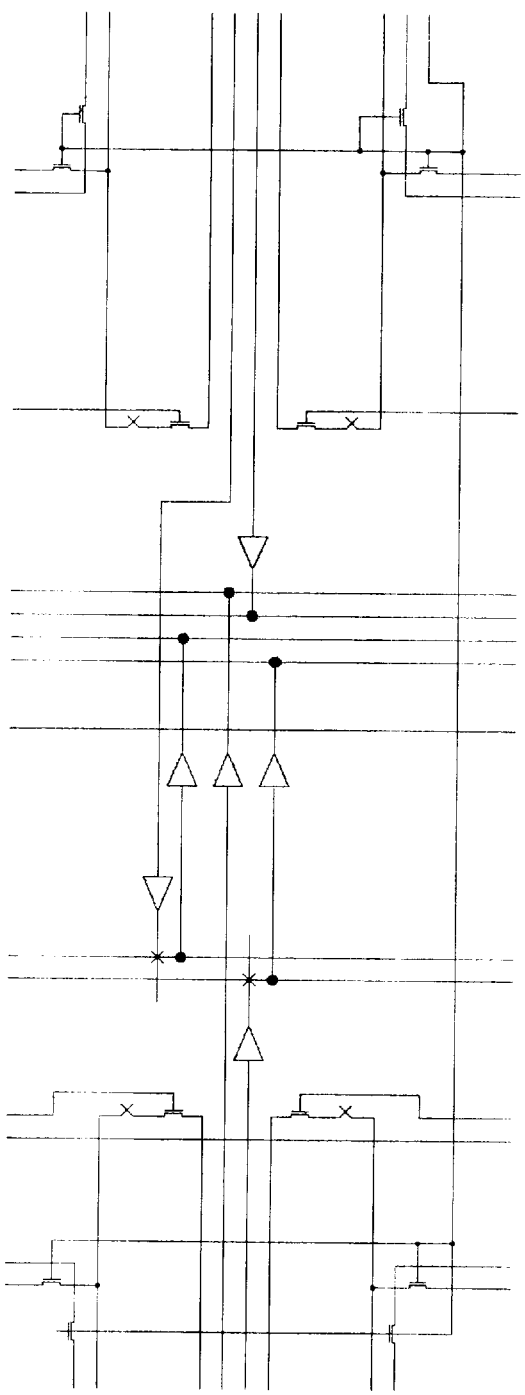
Figure 1L:
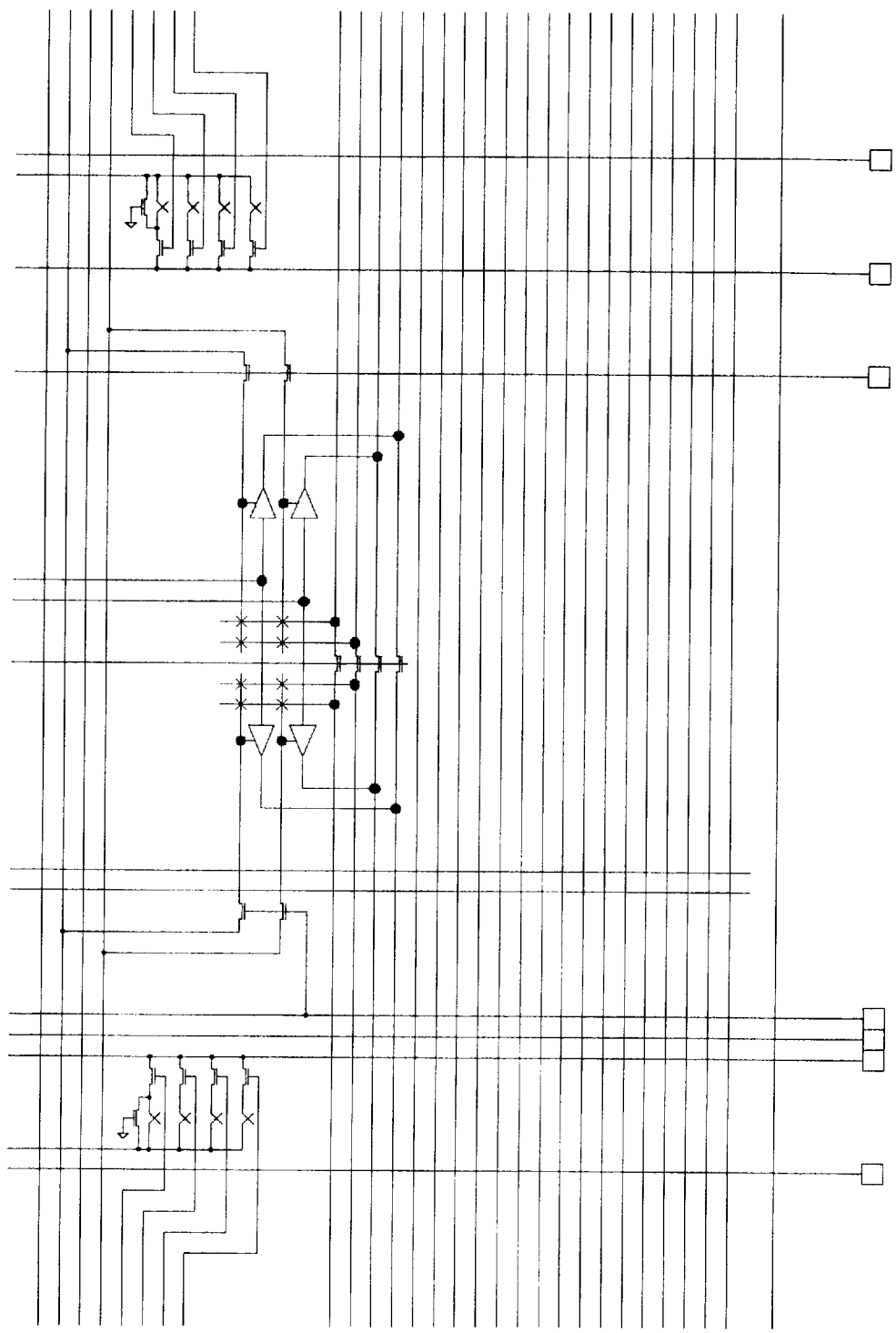
Figure 1M:
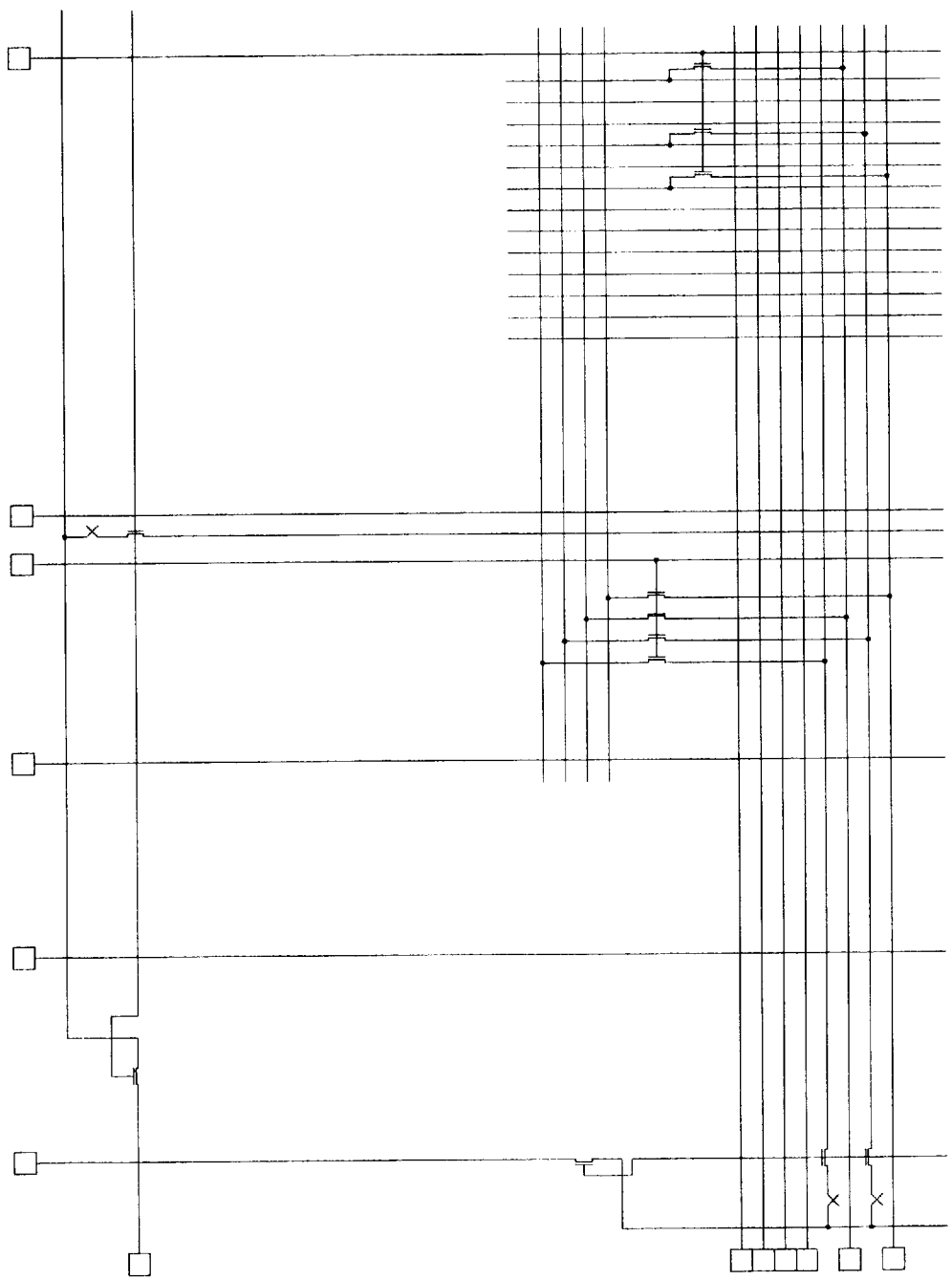
Figure 1N:
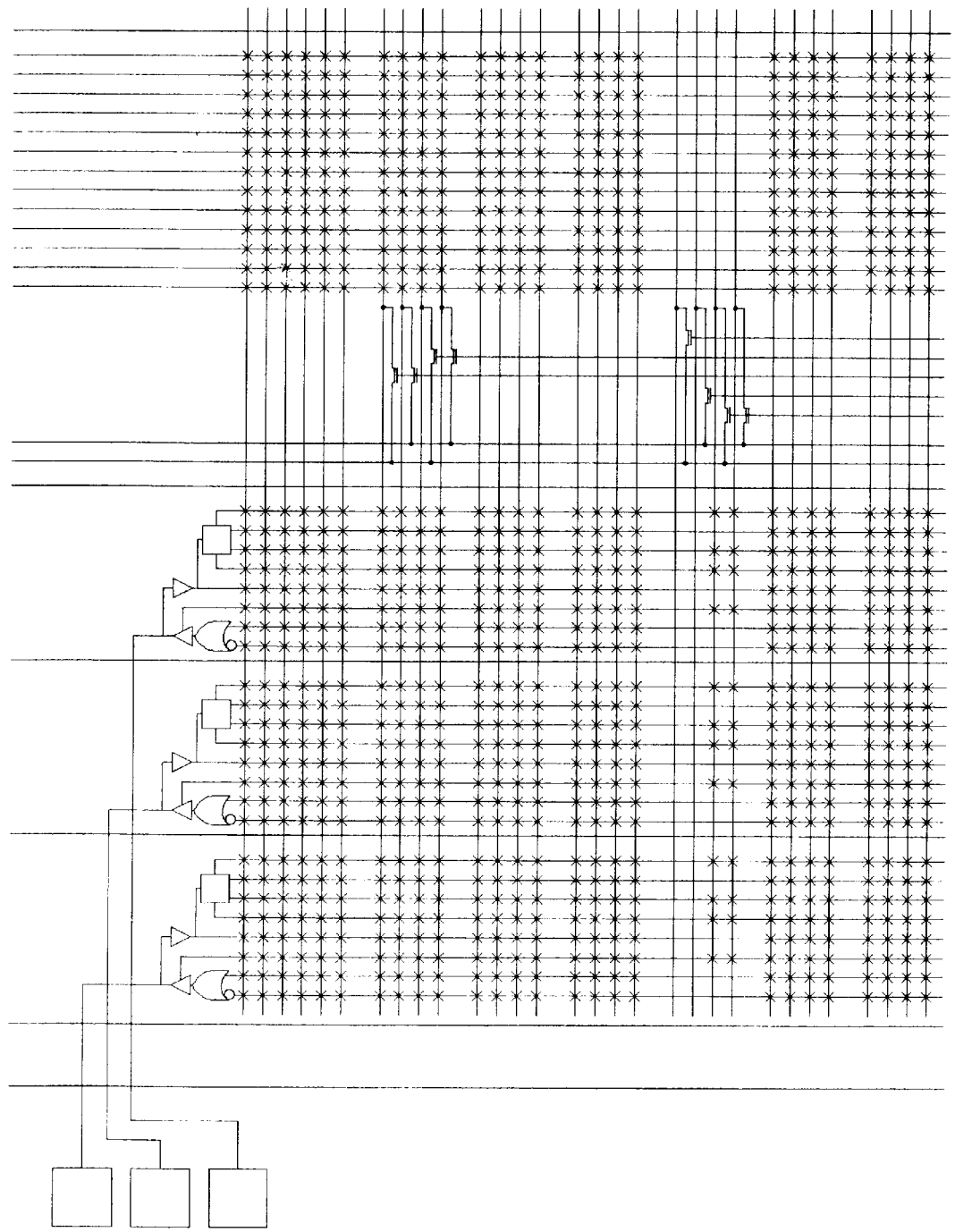
Figure 1N:
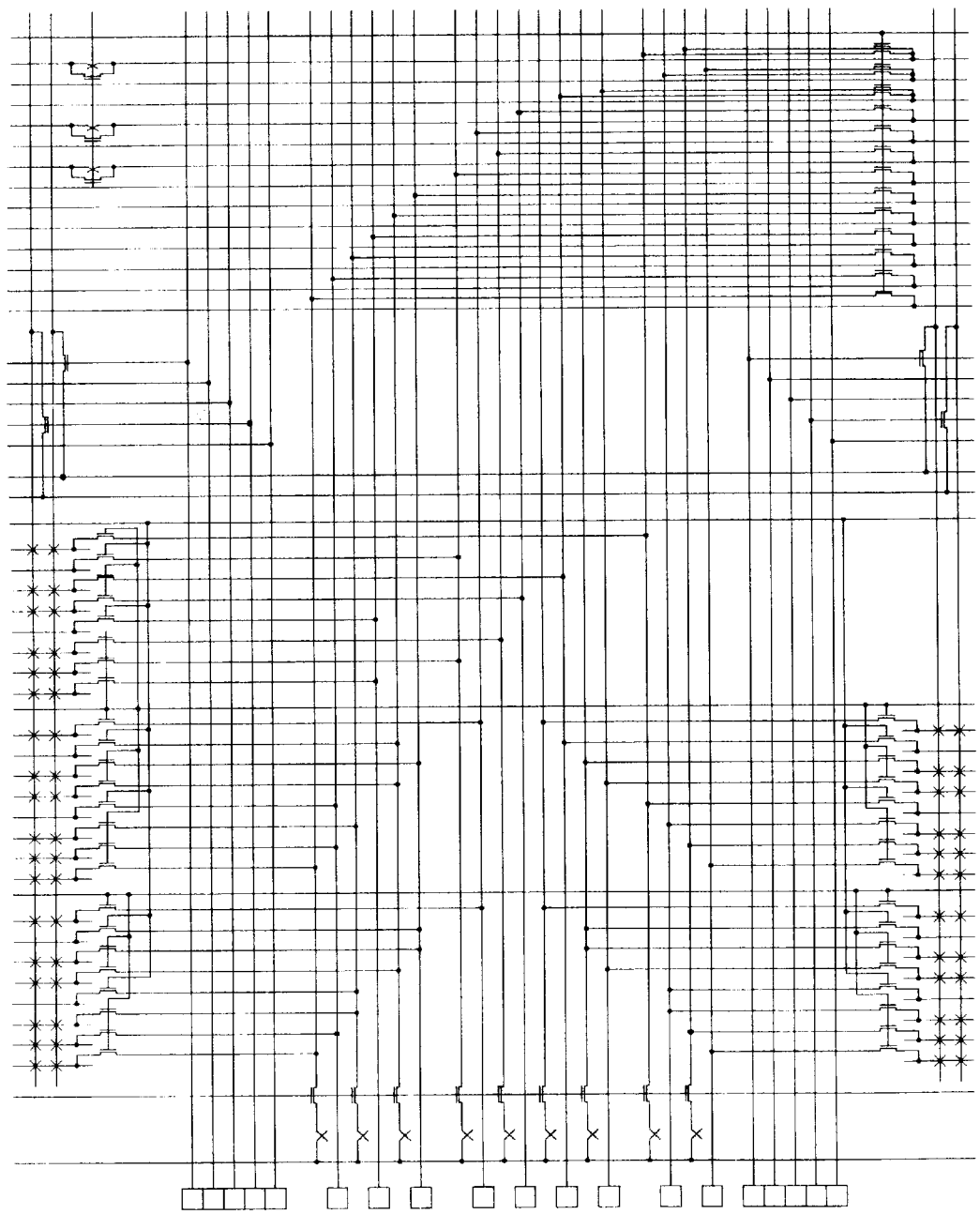
Figure 1N:
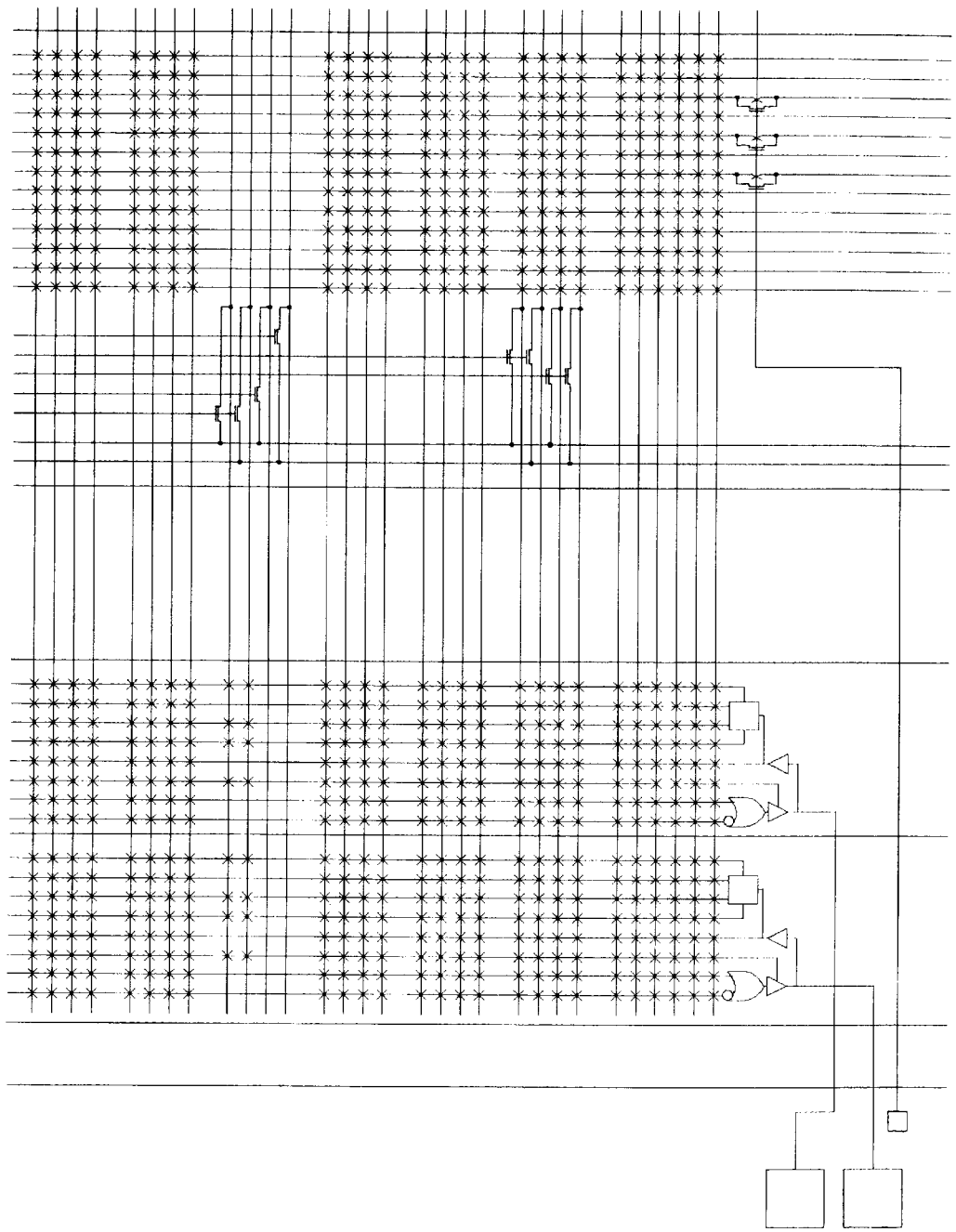
Figure 1P:
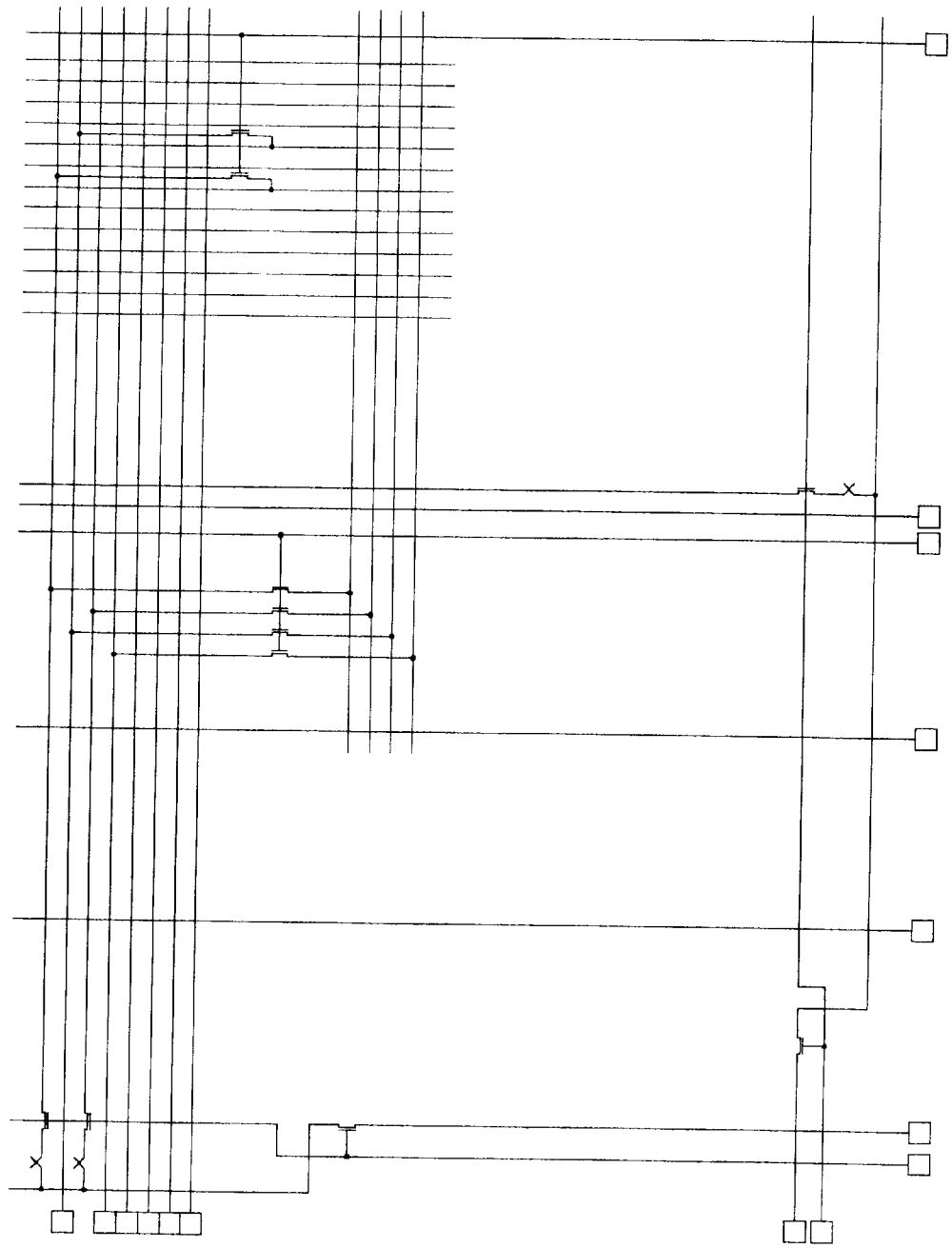

Although two structures of FIG. 1B are disposed between the structures of FIG. 1A and 1C and two structures of FIG. 1B are disposed between the structures of FIG. 1C and 1D in the composite schematic, it is to be understood that additional structures of FIGS. 1B could be provided to make a wider integrated circuit. Similarly, additional structures of FIGS. 1F could be provided between the structures of FIG. 1B and FIG. 1J to increase the height of the integrated circuit. A repeated portion of the integrated circuit including a module of logic elements and a portion of the programmable interconnect and its programming structure (such as the structure of FIG. 1F) is called a "macrocell". Various aspects of the programmable integrated circuit of FIG. 1 are set forth below in further detail. The microfiche appendix includes a complete hierarchical schematic (including test circuitry) of the programmable integrated circuit of FIG. 1. The subject matter of copending application Ser. No. , filed Jun. 21, 1996 ("Interface Cell For A Programmable Integrated Circuit Employing Antifuses" by Kolze et al.) which describes an interface cell of FIG. 1, is hereby incorporated herein by reference.

FIG. 2 is a simplified diagram illustrating a first aspect in accordance with the embodiment of FIG. 1. In FIG. 2, the "X" symbols represent antifuses called cross antifuses. See U.S. Pat. No. 5,424,655 (the subject matter of which is incorporated herein by reference) for background information. Any suitable antifuse structure can be used including, but not limited to amorphous silicon antifuses and oxide-nitride-oxide antifuses. See, for example, U.S. Pat. No. 5,502,315 entitled "Electrically Programmable Interconnect Structure Having a PECVD Amorphous Silicon Element" (the subject matter of which is incorporated herein by reference) and U.S. patent application Ser. No. 07/892,466 entitled "Programmable Interconnect Structures And Programmable Integrated Circuits"(the subject matter of which is incorporated herein by reference) for some suitable amorphous silicon antifuse structures.

In FIG. 2, the inputs and the outputs of a logic module 1 are disposed on the right side of the module. An antifuse is disposed at each location where one of the horizontally extending routing wire segments 2–7 crosses one of the vertically extending routing wire segments 8–12. Antifuse 13, for example, can be programmed to couple horizontally extending routing wire segment 2 to vertically extending routing wire segment 12. To program one of the antifuses, an adequately large voltage is supplied across the antifuse so that a programming current will flow through the antifuse and so that the antifuse will form a permanent, low-impedance connection. The polarity of the voltage placed across the antifuse during programming can be alternated in accordance with teachings set forth in U.S. Pat. No. 5,302,546 entitled "Programming of Antifuses"(the subject matter of which is incorporated herein by reference). The term "wire segment" is used here because it is used in the art but it is to be understood that these conductive routing wire segments can be made of any suitable conductive material or combination of materials and need not be made of metal.

Programming transistors 14–19, vertically extending programming conductors 20–22, and programming drivers 23–25 are provided so that a programming voltage can be supplied to a desired horizontally extending routing wire segment to program a desired antifuse. The desired vertically extending routing wire segment is supplied with ground potential by other circuitry (not shown). See FIG. 1F for additional details. The programming drivers 23–25 are disposed relatively close to an upper side of the integrated circuit and programming conductors 20–22 extend vertically past successive modules down through the integrated circuit. Two programming control drivers 25A and 26 and two horizontally extending programming control conductors 27–28 are provided to control the programming transistors. In the illustrated embodiment, the programming control drivers are disposed relatively close to a left side of the integrated circuit and the programming control conductors 27–28 extend to the right across approximately half of the integrated circuit.

In this embodiment, each of the programming transistors 14–19 is coupled to a unique combination of programming control conductor and vertically extending programming conductor. The number of programming transistors that are uniquely controlled is equal to the product of the number of programming conductors and the number of programming control conductors. In a preferred embodiment, the number of programming conductors is substantially equal to the number of programming control conductors. Accordingly, the number of conductors extending significant lengths across the integrated circuit for a given number of antifuses (programming conductors and programming control conductors) is minimized.

Figure 3:
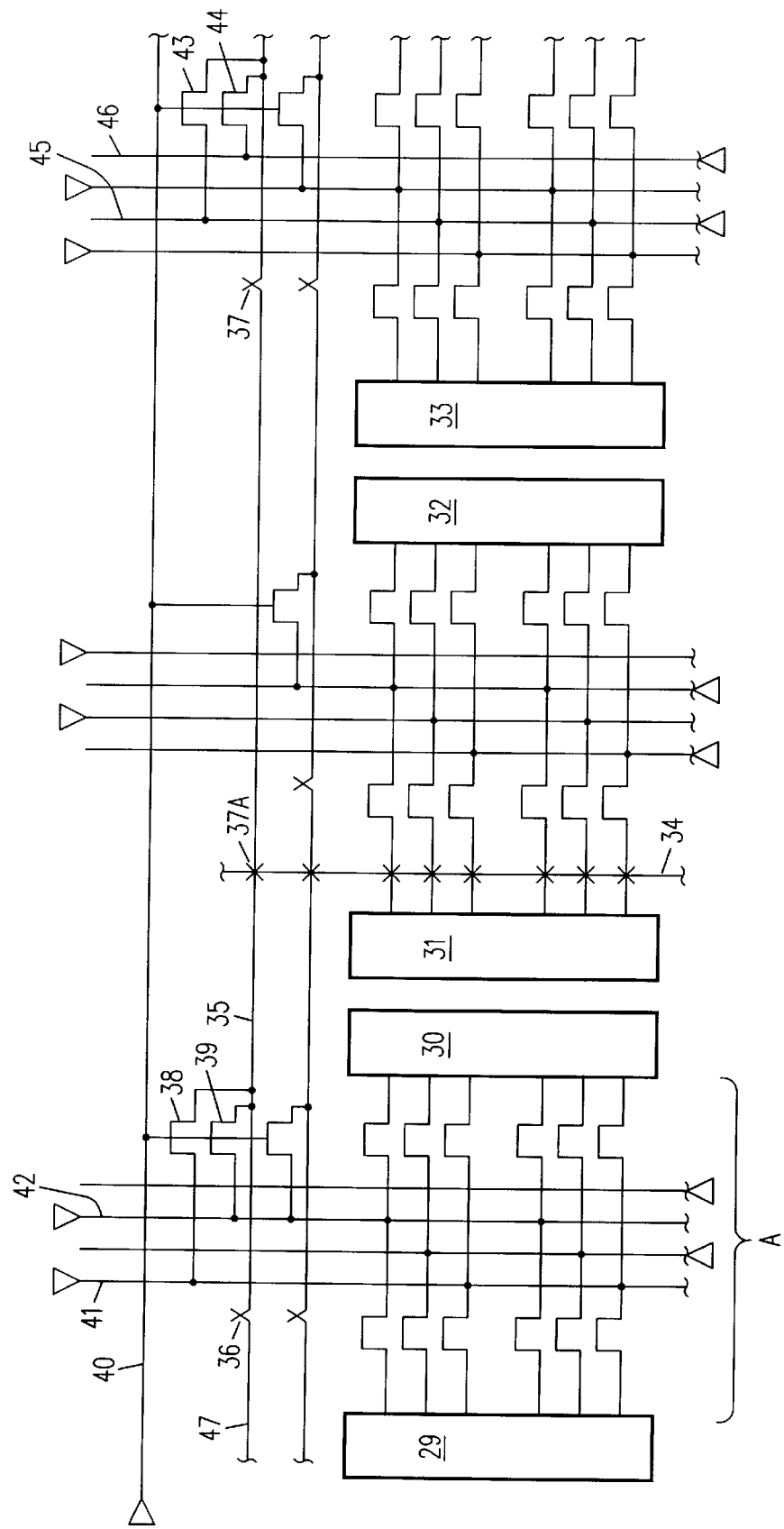
FIG. 3 is a simplified diagram illustrating a second aspect in accordance with the embodiment of FIG. 1.

FIG. 3 is a simplified diagram illustrating a second aspect in accordance with the embodiment of FIG. 1. A plurality of modules 29–33 is disposed in a row on an integrated circuit. Horizontally extending routing wire segments and associated programming transistors are illustrated in FIG. 3 but are not labeled in order to clarify the illustration. Only one vertically extending routing wire segment 34 is illustrated but it is understood that numerous other such vertically extending routing wire segments exist as well as antifuses disposed where the vertically extending and horizontally extending routing wire segments cross. The programming control conductors corresponding with control conductors 27 and 28 of FIG. 2 are also omitted to simplify the illustration.

In one embodiment, it is desired to program antifuses with a magnitude of programming current that exceeds the maximum peak current which will flow through the antifuse during normal operation by at least a certain factor. For example, the programming current may be made to exceed the peak normal operating current by a factor of approximately 2.3. See U.S. patent application Ser. No. 08/541,662 entitled "Reducing Programming Time of A Field Programmable Gate Array Employing Antifuses"(the subject matter of which is incorporated herein by reference) for additional details.

It is generally desirable to drive long nets with logic elements having high current drive capability so that the time required to switch the voltage level on the long net is reduced. Special interface cells having high drive input buffers are therefore provided in the integrated circuit. In the event a long net is to be driven by circuitry in a module, multiple identical output logic elements of the module can be coupled together in parallel to provide added current drive capability. When such high drive circuitry is coupled to a long net, the possibility exists that an increased switching current will pass through antifuses disposed electrically in series in the net. Such antifuses are therefore programmed with larger amounts of programming current. Moreover, the programming transistors associated with the programming of these antifuses are made larger to handle the increased amounts of programming current. Making these programming transistors larger may increase the size of the integrated circuit. It is therefore desired to limit the number of antifuses that can experience such high switching current conditions.

Routing software is employed to determine how a user's circuit will be implemented on the integrated circuit. This routing software is therefore designed to restrict the types of wire segments to which an output of a high drive current element can be coupled. Accordingly, the antifuses on other wire segment types generally do not require large programming currents and the programming transistors associated with these other types of wire segments can be made smaller.

In FIG. 3, one horizontally extending routing wire segment 35 extends from antifuse 36, past four modules 30–33, and to antifuse 37. It is therefore called a "quad"wire segment. In the embodiment of FIG. 3, it extends more than twice as far as distance A between adjacent logic modules 29 and 30. The quad wire type is chosen to be a type of wire to which the output of a high drive element can be coupled because there are relatively few quad wire segments and because it is generally desirable to route long nets on relatively long wire segments (such as quad wire segments). Accordingly, antifuses disposed along the quad wire segments (such as antifuses 36, 37 and 37A) are programmed using large programming currents.

To facilitate a high programming current for antifuse 37 disposed on quad wire segment 35, two programming transistors 38 and 39 are provided. These two programming transistors 38 and 39 are both controlled by the same programming control conductor 40. Programming transistor 38 conducts programming current from vertically extending programming conductor 41 and programming transistor 39 conducts additional programming current from vertically extending programming conductor 42. To program antifuse 37, for example, programming control conductor 40 turns on transistors 38, 39, 43 and 44. Programming conductors 41 and 42 are driven with a programming voltage and programming conductors 45 and 46 are grounded. A large programming current flows from left to right through antifuse 37 and programs antifuse 37.

Other antifuses which are not to be programmed (such as antifuse 36) are not programmed. All routing wire segments are initially precharged with an intermediate voltage (such as half the programming voltage). It is after this precharging that selected routing wire segments are driven with ground and the programming voltage to program-selected antifuses. Where an antifuse is not to be programmed, the programming drivers coupled to at least one routing wire segment coupled to that antifuse are not enabled. If, for example, antifuse 36 were not to be programmed, then the programming drivers for wire segment 47 would not be enabled. With the intermediate voltage present on wire segment 47 from precharging, an adequately large voltage would not be present across antifuse 36 to program antifuse 36 regardless of whether wire segment 35 is driven with the programming voltage or is grounded. In this way, selected antifuses are programmed and other antifuses are not programmed.

As is seen from FIG. 3, the connection of the programming transistors in the vicinity of transistors 38 and 39 and transistors 43 and 44 to the vertically extending programming conductors are not identical from macrocell to macrocell across the integrated circuit. In order to program an antifuse such as antifuse 37, the programming conductors coupled to one wire segment contacting the antifuse are driven from one side of the integrated circuit whereas the programming conductors coupled to the other wire segment contacting the antifuse are driven from another side of the integrated circuit. In FIG. 3, programming conductors 41 and 42 are driven by programming drivers located at the top of the integrated circuit whereas programming conductors 45 and 46 are driven by programming drivers located at the bottom of the integrated circuit. In this respect, the composite schematic of FIG. 1 is a simplification. For example, successive macrocells of FIG. 1F extending across the integrated circuit of FIG. 1 in the horizontal dimension are not exactly identical in the region corresponding with the region of FIG. 3 around programming transistors 38 and 39.

Figure 4A:
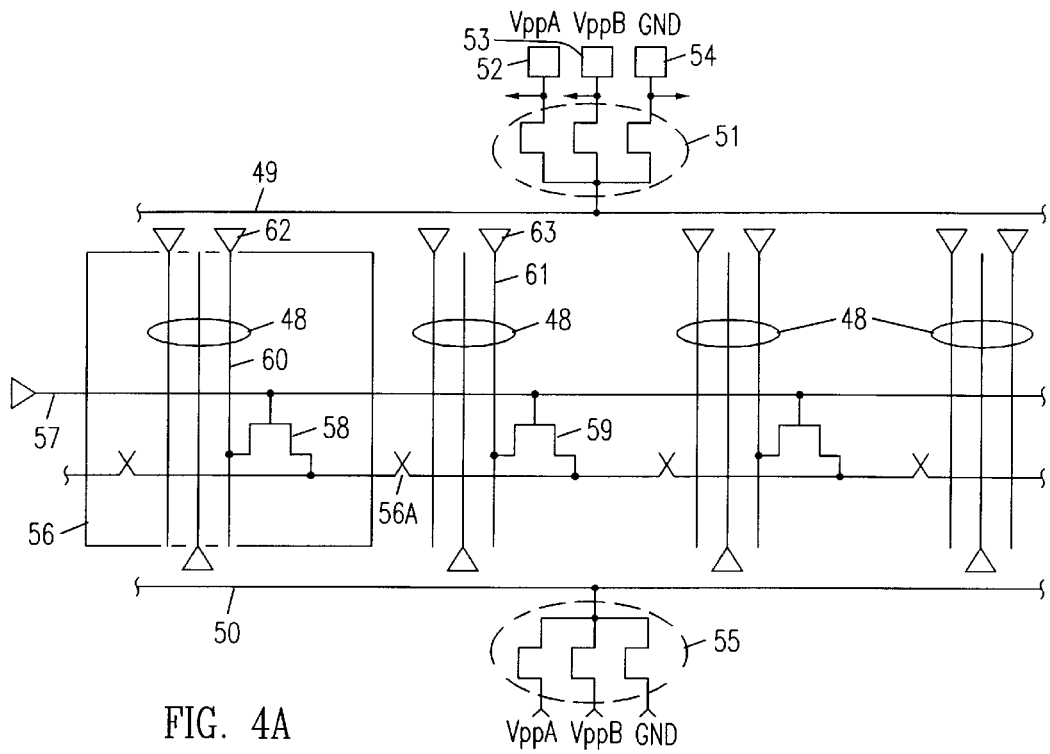
FIGS. 4A and 4B are simplified diagrams illustrating a third aspect in accordance with the embodiment of FIG. 1.

FIG. 4A is a diagram illustrating an integrated circuit having vertically extending programming conductors 48 and associated programming drivers. An individual programming conductor is driven by a programming driver from either the top end or the bottom end. A programming bus 49 extends along the top row of programming drivers and another programming bus 50 extends along the bottom row of programming drivers. The top and bottom rows of programming drivers are controlled by top and bottom programming shift registers (not shown) respectively such that each programming driver is either enabled or is not enabled. An enabled programming driver in the top row drives its associated vertically extending programming conductor with a voltage present on the programming bus 49 whereas a programming driver in the top row that is not enabled is effectively isolated from its associated vertically extending programming conductor and does not drive its vertically extending programming conductor. A programming current multiplexer circuit 51 comprising transistors couples either a first programming voltage (VppA) terminal 52, or a second programming voltage (VppB) terminal 53, or a ground (GND) terminal 54 to the top programming bus 49. A similar programming current multiplexer circuit 55 is provided to couple the bottom programming bus 50 to one of the three terminals 52, 53 or 54.

In the structure illustrated in FIG. 4A, the integrated circuit comprises a plurality of substantially identical macrocell structures adjoining each other in a two-dimensional array. The region 56 represents the area occupied by a column of such macrocells. The interconnection of programming transistors and programming conductors in each such region is substantially identical. (The incorporation of "quad wires", for example, introduces minor differences in some macrocells). If it were desired to program antifuse 56A, programming control conductor 57 would be controlled to turn programming transistors 58 and 59 on. Corresponding programming conductors 60 and 61 would then supply programming current which would flow through antifuse 56A. This is, however, not possible because programming drivers 62 and 63 are both in the top row of programming drivers (supplied by the same programming bus) and therefore can only supply (if enabled) the same voltage (the voltage on programming bus 49).

Figure 4B:
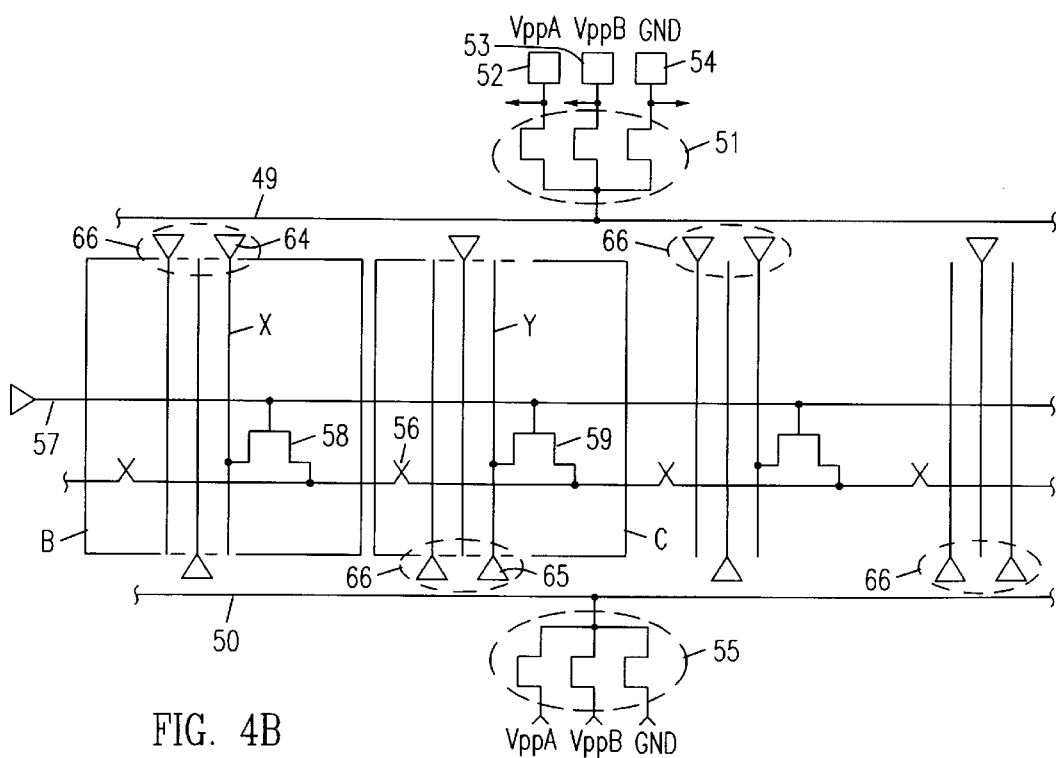

FIG. 4B is a simplified diagram illustrating a third aspect in accordance with the embodiment of FIG. 1. Rather than having corresponding programming conductors of adjacent regions driven by programming drivers on the same side of the integrated circuit as in FIG. 4A, one programming conductor X is driven by a programming driver 64 on one side of the integrated circuit whereas the corresponding programming conductor Y of the adjacent region is driven by a programming driver 65 on the opposite side of the integrated circuit. In FIG. 4B, the pattern 66 of which programming conductors are driven by programming drivers on that side of the integrated circuit is repeated on the opposite side of the integrated circuit for each adjacent column of macrocells. B and C indicate boundaries of adjacent substantially identical columns of macrocells and X and Y indicate corresponding programming conductors in the two adjacent column regions B and C. For additional information on the structure, operation and use of a programming current multiplexer circuit, see U.S. Pat. No. 5,495,181 entitled "Integrated Circuit Facilitating Simultaneous Programming of Multiple Antifuses"(the subject matter of which is incorporated herein by reference).

Figure 5:
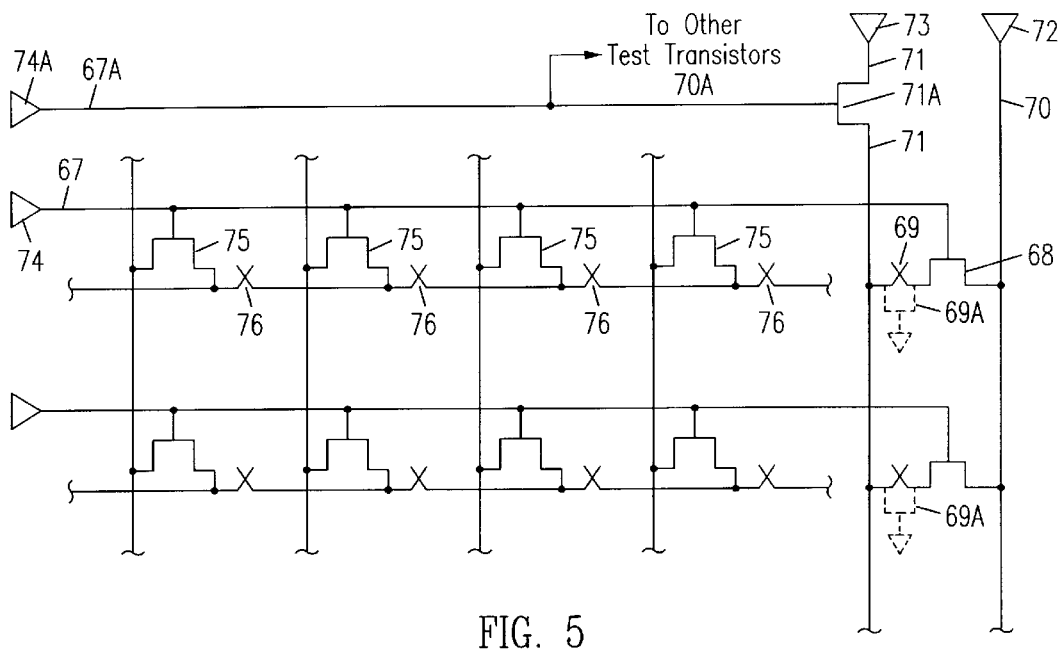
FIG. 5 is a simplified diagram illustrating a fourth aspect in accordance with the embodiment of FIG. 1.

FIG. 5 is a simplified diagram illustrating a fourth aspect in accordance with the embodiment of FIG. 1. It is desired to test the continuity of a programming control conductor such as programming control conductor 67. A test transistor 68, a test antifuse 69, two test conductors 70 and 71, and two programming drivers 72 and 73 are therefore provided. If programming control driver 74 can drive programming control conductor 67 with an adequately high voltage that test transistor 68 turns on and a programming voltage present between test conductors 70 and 71 programs test antifuse 69, then it is assumed that the programming transistors 75 coupled to the programming control conductor 67 between the programming control driver 74 and the test transistor 68 can also be driven with an adequately high voltage to program antifuses 76. The test antifuse is provided only for test and is not used in normal circuit operation. In some embodiments, test transistor 68 is smaller than the programming transistors 75.

Figure 6:
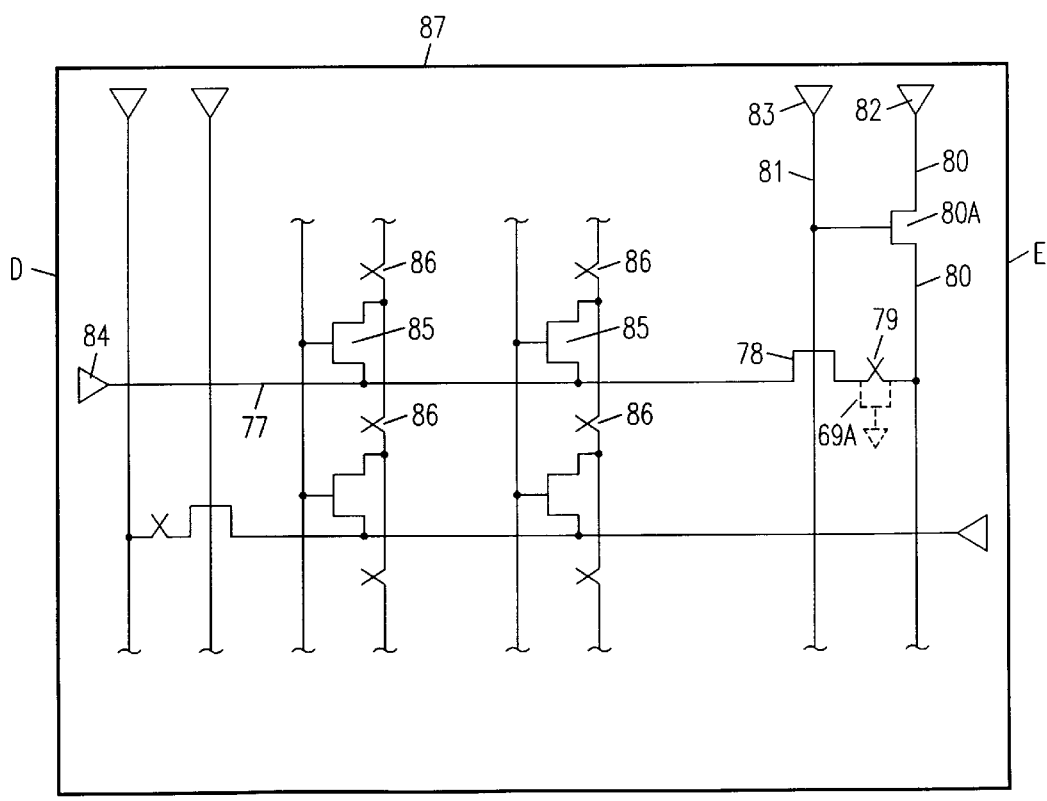
FIG. 6 is a simplified diagram illustrating a fifth aspect in accordance with the embodiment of FIG. 1.

FIG. 6 is a simplified diagram illustrating a fifth aspect in accordance with the embodiment of FIG. 1. It is desired to test the continuity of a programming conductor such as programming conductor 77. A test transistor 78, a test antifuse 79, two test conductors 80 and 81, a programming driver 82 and a programming control driver 83 are therefore provided on the integrated circuit 87. Programming control driver 83 controls test transistor 78 to be conductive. In this embodiment, test conductors 80 and 81 extend parallel and adjacent to side E of integrated circuit 87. Programming driver 84 is disposed on opposite side D of integrated circuit 87. If programming driver 84 can drive an adequately large amount of current at an adequately high voltage through programming conductor 77 and test transistor 78 to program test antifuse 79; then it is assumed that the programming transistors 85 coupled to the programming conductor 77 can also be supplied with an adequately large amount of current to program antifuses 86. The test antifuse 79 is provided only for test and is not used in normal circuit operation. In some embodiments, test transistor 78 is smaller than the programming transistors 85.

FIGS. 5 and 6 illustrate additional test transistors 69A disposed in parallel with corresponding respective test antifuses. These test transistors 69A should be nonconductive because their gates are permanently coupled to ground as shown. If there is a problem with the process used to fabricate the integrated circuit such that a test transistor 69A is sufficiently leaky that the corresponding test antifuse cannot be programmed correctly, then the fact that this test antifuse was not correctly programmed is detectable as described above. Because such problems with transistors tend to evidence themselves throughout the integrated circuit, this test for defective test transistors 69A is useful in detecting problems with other transistors which do not have corresponding parallel-connected test transistors. (These test transistors do not need to be placed in parallel with every test antifuse, so they are shown with dashed lines in FIGS. 5 and 6). The test transistors 69A can be made smaller than other ordinary programming transistors.

Note that there are transistors 71A and 80A disposed in vertically extending test conductors 71 and 80 respectively. These transistors 71A and 80A are considered part of their respective test conductors. A special test control driver 74A is also provided in FIG. 5 and a horizontally extending control conductor 67A is coupled to the gate of transistor 71A. In some embodiments, there is only one such special test control driver 74A on the entire integrated circuit and it is part of one of the programming shift registers.

Figure 7:
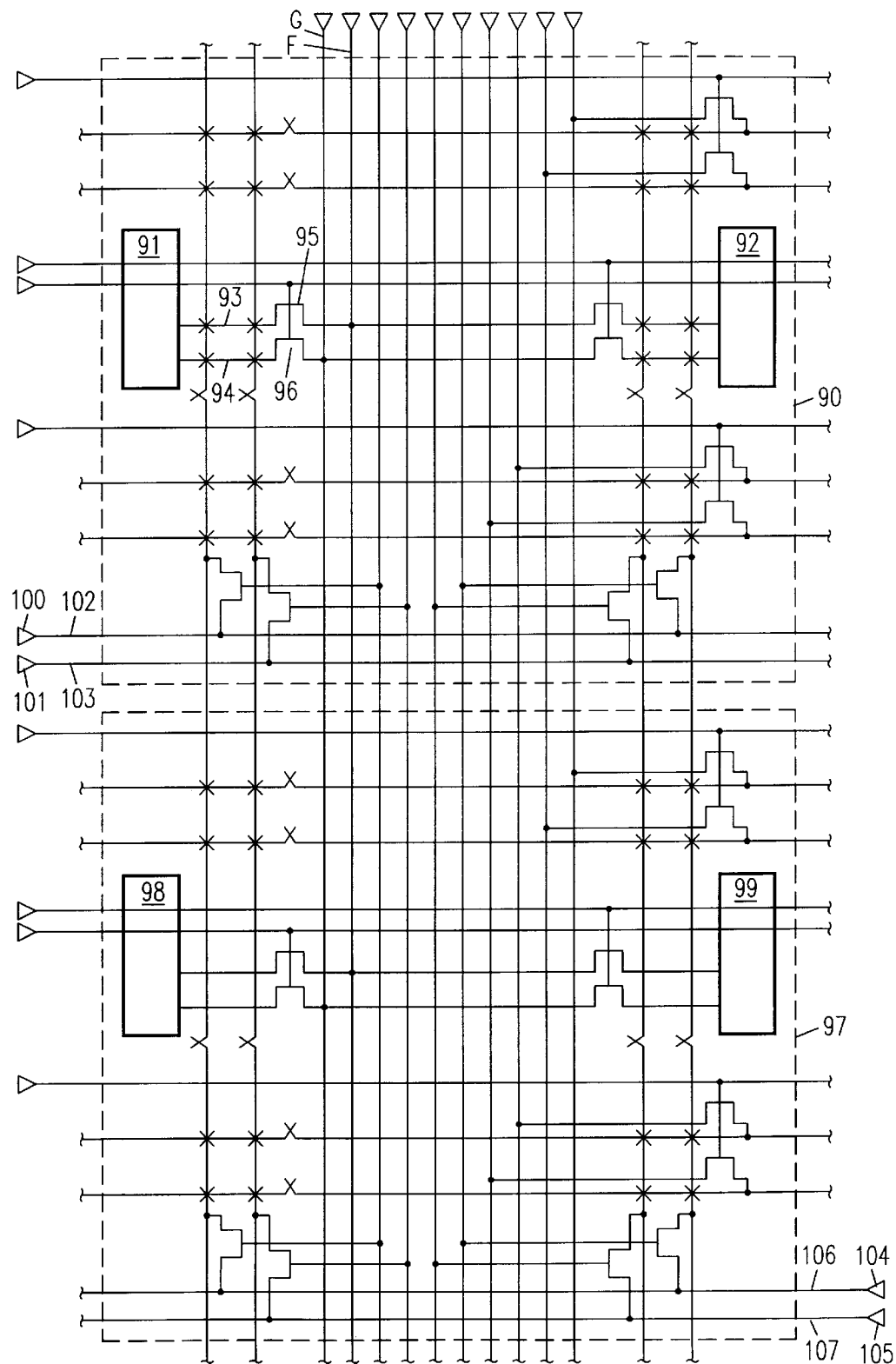
FIG. 7 is a simplified diagram illustrating a sixth aspect in accordance with the embodiment of FIG. 1.
Figure 8:
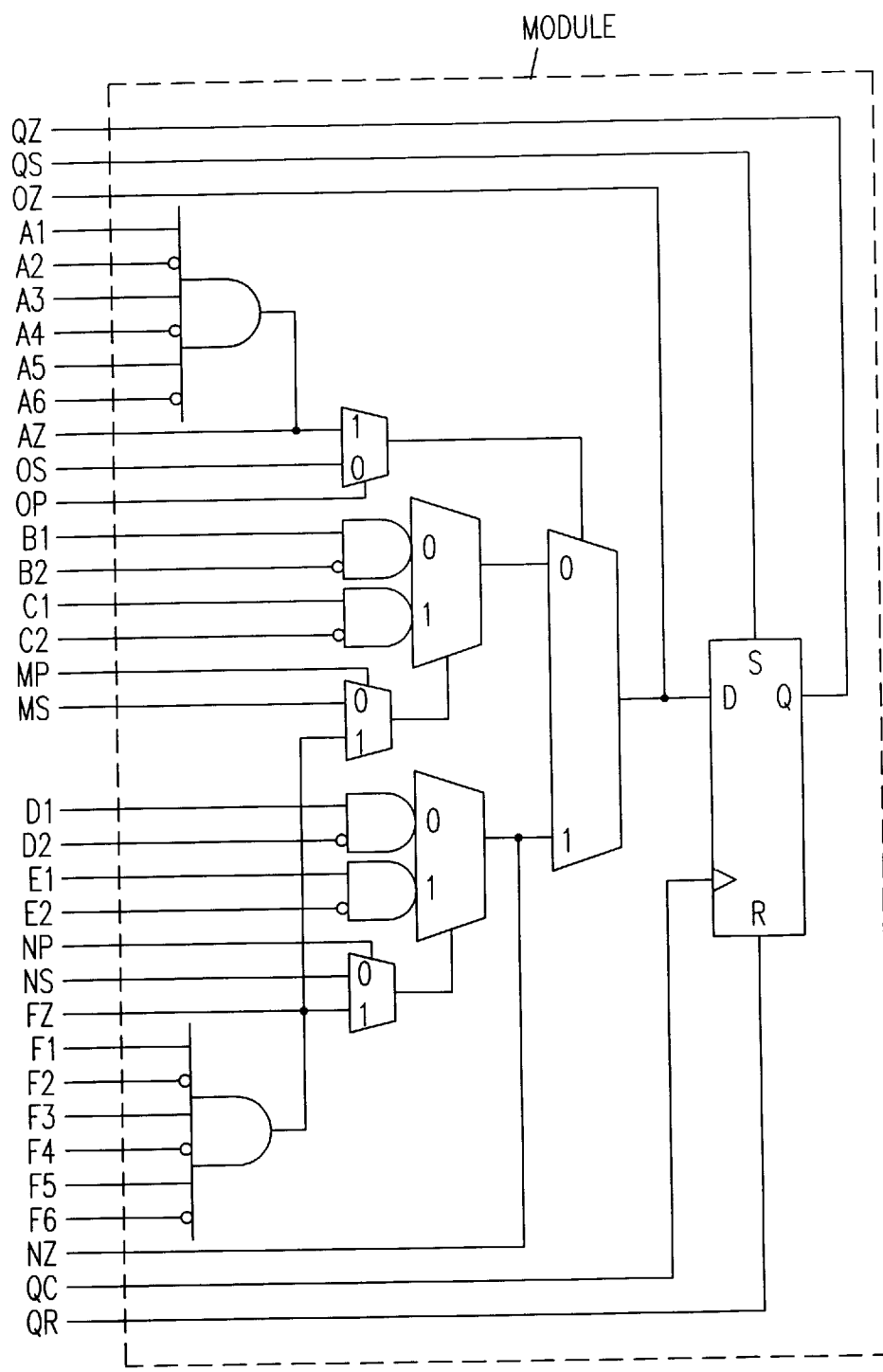
FIG. 8 is a simplified diagram of one suitable logic module usable in accordance with the embodiment of FIG. 1.

FIG. 7 is a simplified diagram illustrating a sixth aspect in accordance with the embodiment of FIG. 1. A macrocell 90 has a first logic module 91 and a second logic module 92. The structure of the second logic module is a substantially mirrored version of the structure of the first logic module. The inputs and outputs of the logic elements in the first logic module are disposed on the right side of the first logic module whereas the inputs and outputs of the logic elements in the second logic module are disposed on the left side of the second logic module. Any suitable logic module can be used. FIG. 8 is a simplified diagram of one suitable logic module. See U.S. Pat. No. 5,416,367 entitled "Programmable Application Specific Integrated Circuit And Logic Cell Therefor"(the subject matter of which is incorporated herein by reference) for circuit details concerning a similar module architecture.

Not only is the logic module 91 of macrocell 90 mirrored, so too are the horizontally extending routing wire segments 93 and 94 extending from the logic module 91 and the associated programming transistors 95 and 96. As a result, the vertically extending programming conductors F and G are shared between the two logic modules of the macrocell 90. In this embodiment, a plurality of macrocells is disposed in a column with the vertically extending programming conductors extending through each macrocell. FIG. 7 illustrates a second macrocell 97 containing two logic modules 98 and 99. The programming drivers 100 and 101 associated with horizontally extending programming conductors 102 and 103 of the first macrocell 90 are disposed on the left side of the column whereas the programming drivers 104 and 105 associated with the horizontally extending programming conductors 106 and 107 of the second macrocell 97 are disposed on the right side of the column.

Figure 9:
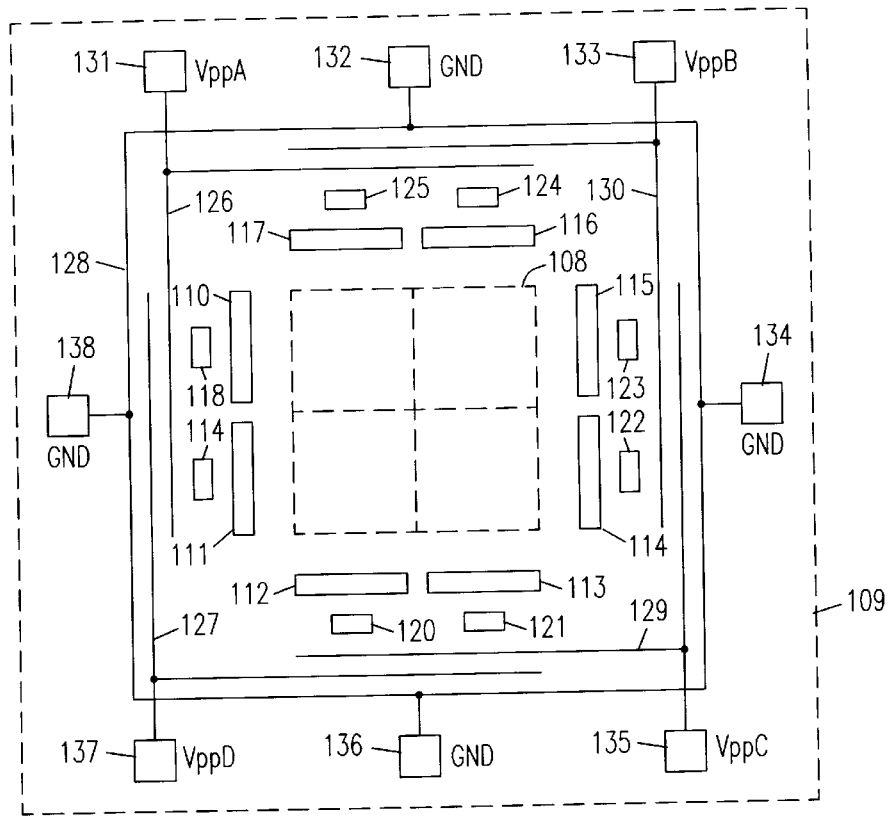
FIGS. 9, 9A and 9B are simplified diagrams illustrating a seventh aspect in accordance with the embodiment of FIG. 1.

FIG. 9 is a simplified diagram illustrating a seventh aspect in accordance with the embodiment of FIG. 1. An array 108 of macrocells is disposed in the center of an integrated circuit 109. Eight programming shift registers 110–117 are disposed around the periphery of the array 108. The programming drivers and programming control drivers that drive programming conductors and programming control conductors that extend horizontally in the upper left quadrant of the array are disposed in programming shift register 110. Similarly, the programming drivers and programming control drivers that drive programming conductors and programming control conductors that extend vertically in the upper left quadrant of the array are disposed in programming shift register 117. The remainder of the programming drivers and programming control drivers are similarly situated in the other programming shift registers.

Each programming shift register is coupled to a separate programming current multiplexer circuit. Programming shift register 110, for example, is coupled to programming current multiplexer circuit 118. Each programming current multiplexer circuit is controlled to couple one of a first programming power bus, a second programming power bus, or a ground bus to its associated programming shift register. Programming current multiplexer circuit 118, for example, can couple either first programming power bus 126, second programming power bus 127 or ground bus 128 to associated programming shift register 110.

Each programming driver has a bit in its programming shift register. When this bit is set, the programming driver is enabled to drive its programming conductor with the voltage supplied from its programming current multiplexer circuit. When the bit is not set, the programming driver is isolated from its programming conductor (and does not drive its programming conductor with any voltage). Similarly, each programming control driver has a bit in its associated programming shift register. When this bit is set, the programming control driver drives its programming control conductor with a high voltages sufficient to turn on a programming transistor such that the programming transistor can pass the programming voltage onto its associated routing wire. When this bit is not set, the programming control driver drives its programming control conductor with a low voltage which does not turn on any programming transistor.

In this embodiment, integrated circuit 109 has four L-shaped programming power busses 126, 127, 129 and 130. An L-shaped programming power bus extends in a dimension substantially parallel with a side of the integrated circuit and also extends in a perpendicular dimension substantially parallel with an adjacent side of the integrated circuit. The programming power busses are fitted together such that each programming current multiplexer circuit is readily coupled to two programming power busses. Programming voltage terminals 131–138 are provided on the integrated circuit so that each programming power bus is coupled to its own programming voltage terminal and so that the ground bus 128 is coupled to ground terminals. Accordingly, the enabled programming drivers in a programming shift register conduct current from one of four programming voltage terminals or the ground terminals depending on how the programming current multiplexer circuit is controlled.

Figures 9A, 9B:
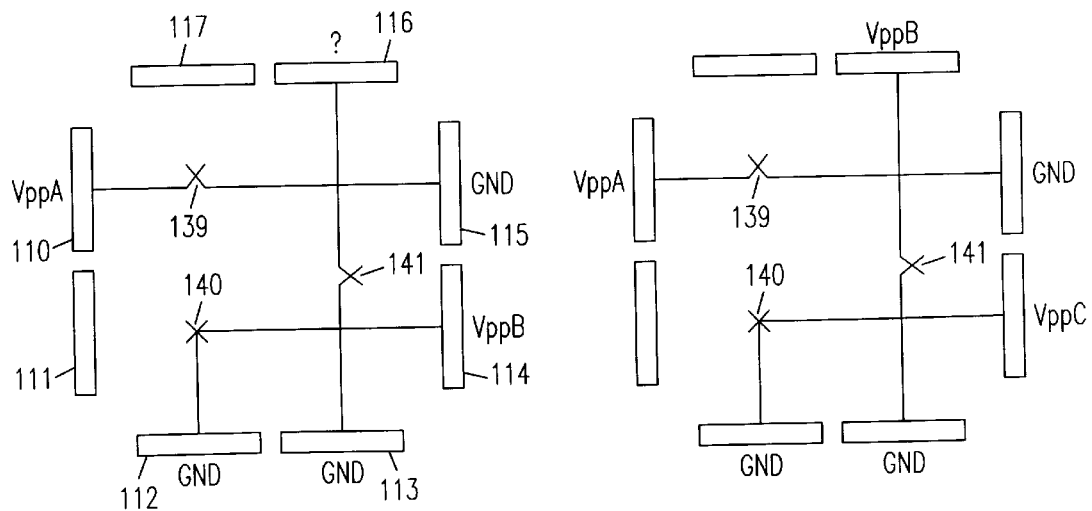
Figure 10:
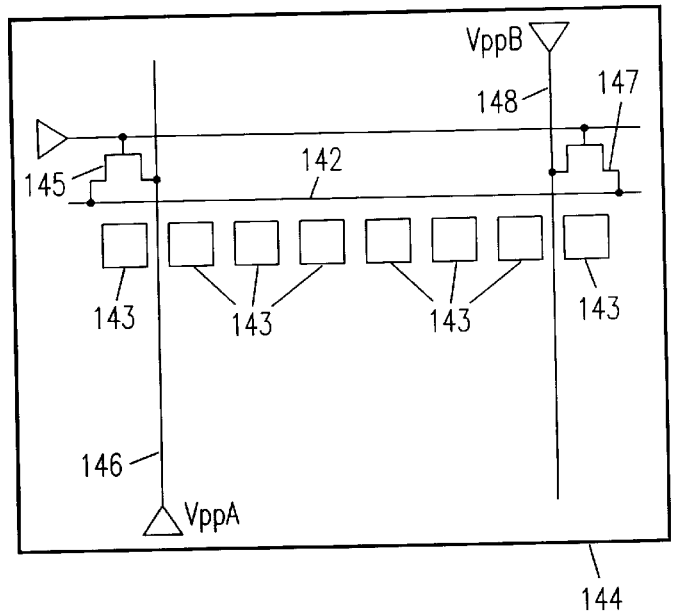

FIGS. 9A and 9B illustrate how the simultaneous programming of multiple antifuses is facilitated by appropriate control of the programming current multiplexer circuits. As explained in U.S. Pat. No. 5,495,181, a separate programming voltage terminal is required for each antifuse being programmed so that it can be insured that an adequate amount of programming current flows through each antifuse being programmed.

Assume, for example, that three antifuses 139–141 are to be programmed simultaneously. If the programming shift registers were coupled to terminals as illustrated in FIG. 9A, then programming current multiplexer circuit 124 could not couple a programming voltage terminal to programming shift register 116 which is not already being used to supply current to an antifuse being programmed. The only two programming voltage terminals that programming current multiplexer circuit 124 can couple to programming shift register 116 are VppA terminal 131 and VppB terminal 133. The programming current multiplexer circuits are therefore intelligently controlled such as shown in FIG. 9B so that the same three antifuses can be simultaneously programmed.

Figure 10:
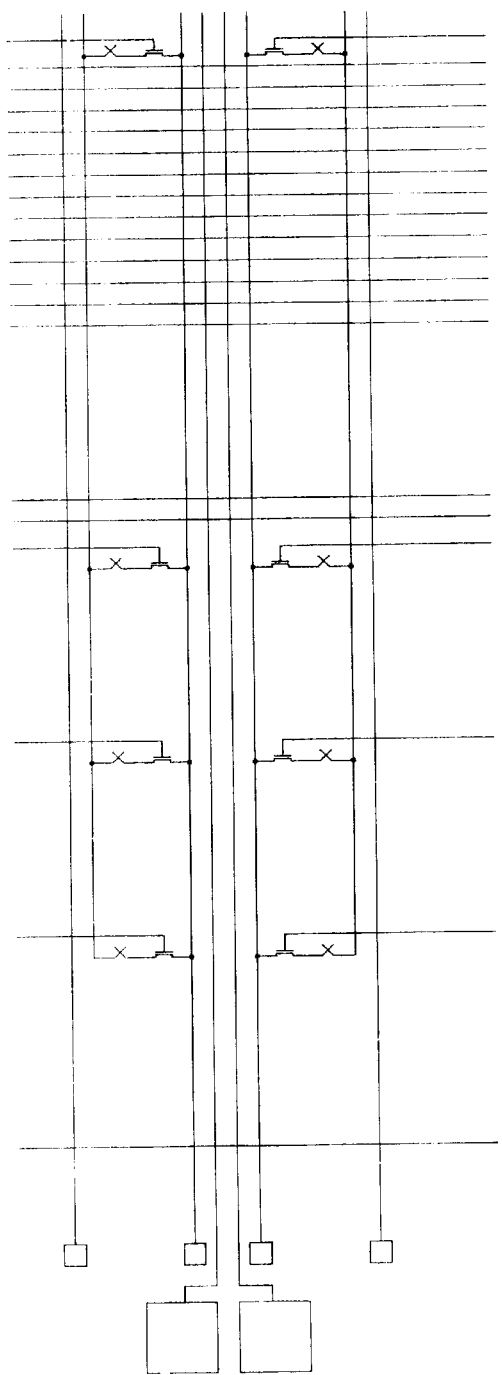
FIG. 10 is a simplified diagram illustrating an eighth aspect in accordance with the embodiment of FIG. 1.

FIG. 10 is a simplified diagram illustrating an eighth aspect in accordance with the embodiment of FIG. 1. In addition to routing wire "segments" that are one macrocell in length and four macrocells in length ("quad"wire segments), other routing wire segments are provided called "dual"wires. "Dual" wires are two macrocells in length. "Express" wires extend substantially across the entire array of macrocells. FIG. 10 illustrates one such express wire 142 which extends the length of eight macrocells 143 substantially all the way across the array of integrated circuit 144.

Because the express wires extend a great distance across the integrated circuit, metal resistance through the express wires may limit the magnitude of the current flowing through the express wires during antifuse programming. It is undesirable to increase significantly the width of the express wires to reduce the resistance through the express wires because making the express wires wider would consume additional space in the metal routing layer. Accordingly, express wires are simultaneously supplied with programming current from two different programming voltage terminals. In this way, programming current is supplied to one electrode of an antifuse being programmed using programming current flowing through two separate programming voltage terminals. One programming voltage terminal supplies programming current via a programming transistor 145 and a programming conductor 146 to the express wire 142 near to one end of the express wire whereas another programming voltage terminal supplies programming current via a programming transistor 147 and a programming conductor 148 to the express wire near an opposite end of the express wire 142. The programming drivers which drive programming conductors 146 and 148 are disposed adjacent opposite sides of integrated circuit 144, and in some embodiments are disposed adjacent opposite corners of integrated circuit 144. The illustration of the macrocells with respect to the programming conductors in FIG. 10, programming transistors and express wire is however merely illustrative. In one embodiment, express wires actually extend horizontally through macrocells above the logic modules in similar fashion to other routing wire segments.

Figure 11:
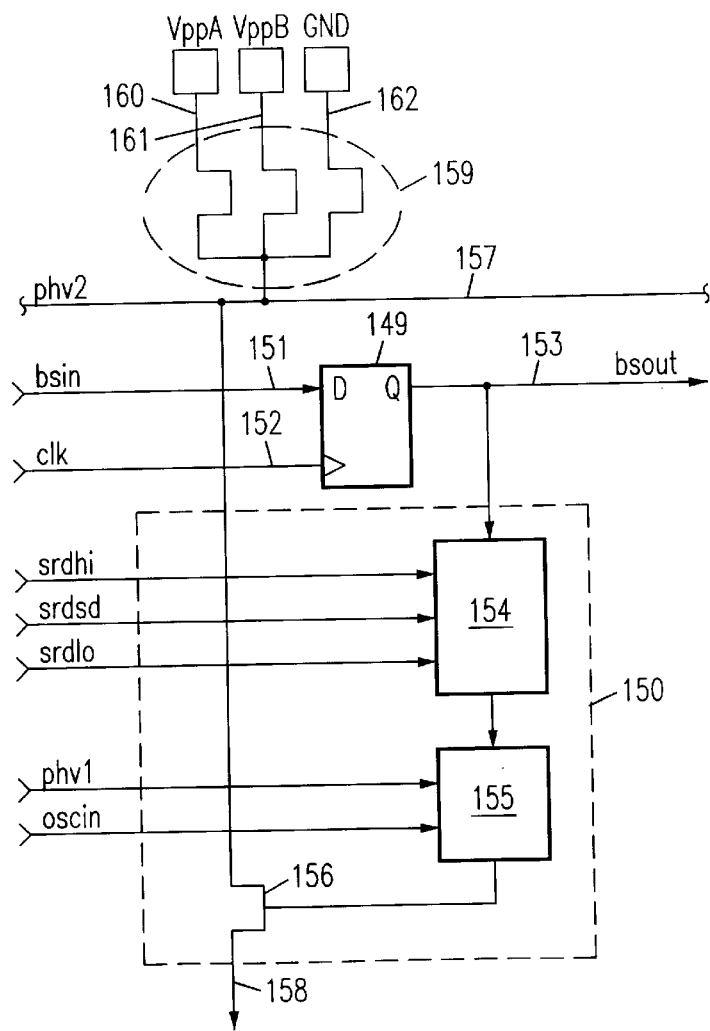
FIG. 11 is a simplified diagram of a bit of a programming shift register and the programming driver associated with the bit.

FIG. 11 is a simplified diagram of a bit 149 (flip-flop) of a programming shift register and the programming driver 150 associated with the bit. A data input lead 151 of bit 149 is coupled to a data output lead of a preceding bit of the programming shift register. All the bets of the shift register are clocked with the same signal on lead 152. Bit 149 outputs its data to the next bit of the programming shift register on output lead 153. Programming driver 150 comprises a test control circuit 154, a charge pump 155 and a transistor 156. If bit 149 is set, transistor 156 may be made conductive to couple a voltage present on programming bus 157 to programming conductor 158 to program an antifuse as described above. A programming current multiplexer circuit 159 is provided to couple one of three terminals 160–162 to the programming bus 157.

Figure 11A:
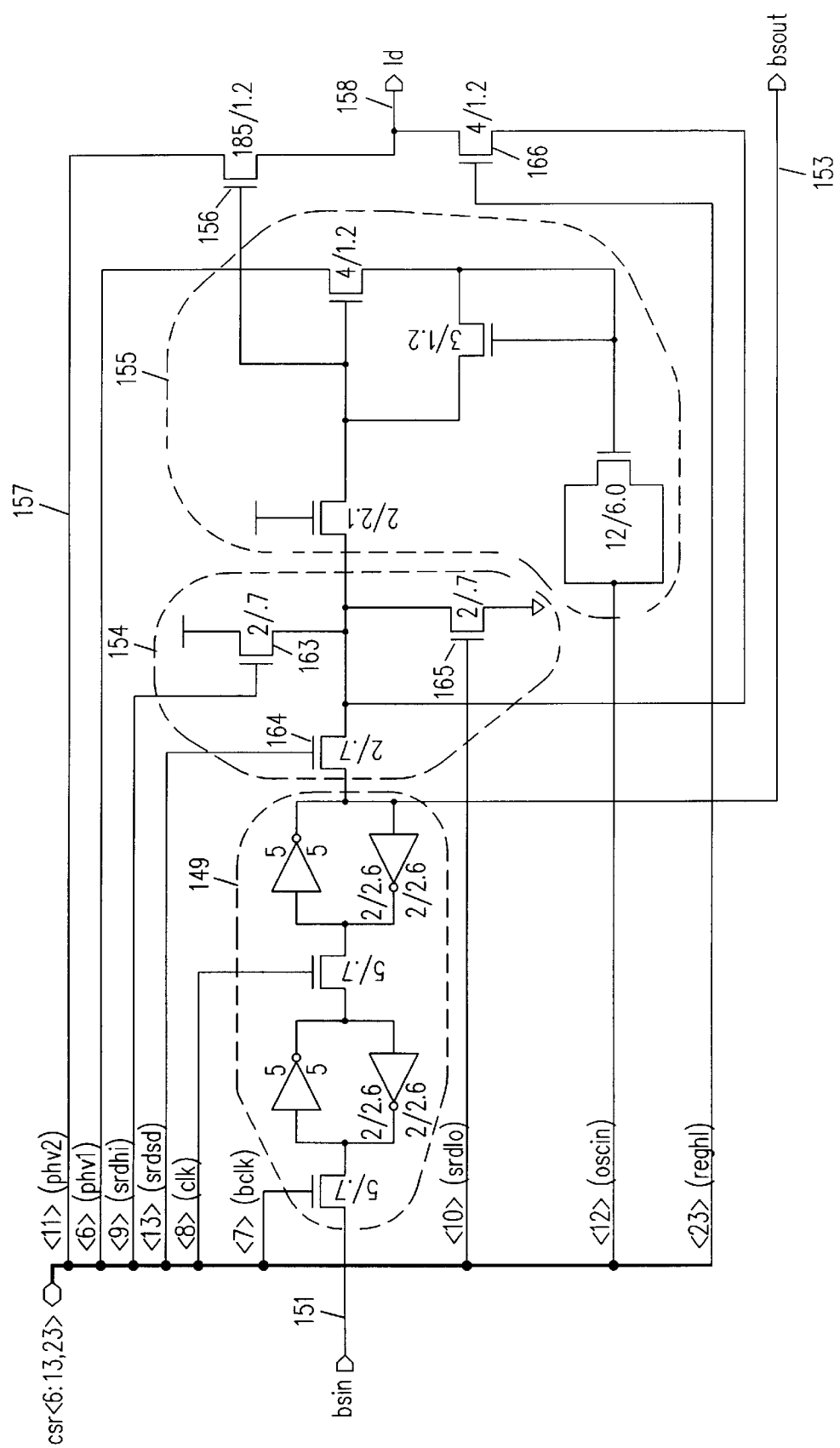
FIG. 11A is a more detailed diagram of the bit and programming driver of FIG. 11.

FIG. 11A is a more detailed diagram of the bit and programming driver of FIG. 11. Charge pump 155 is provided so that the gate of transistor 156 can be supplied with a voltage of a sufficient magnitude (the programming voltage Vpp plus a threshold voltage $V_T$) considering that one electrode of transistor 156 may be supplied with the programming voltage Vpp. Oscin represents an oscillating digital signal with a magnitude of approximately five volts and phv1 represents a dedicated line carrying a high voltage (the programming voltage Vpp). This line phv1 extends from a special charge pump to the multiple other charge pumps on the integrated circuit to assist initial operation of the other charge pumps.

It is undesirable that the voltage levels on the programming conductors switch due to the bits of the programming shift registers being serially loaded. Accordingly, when a particular combination of digital values is present on a plurality of terminals (not shown) of the integrated circuit in a programming mode, a digital high logic level is driven onto lead srdhi. Transistor 163 is therefore made conductive and transistors 164 and 165 are made nonconductive. This makes transistor 156 conductive so that the intermediate voltage which is then present on the programming bus 157 (phv2) is supplied onto the programming conductor 158 for precharging the routing wire segments as described above. The voltage level on the programming conductor 158 therefore does not switch when digital values are shifted through bit 149. After the desired values have been shifted into the bits of the programming shift register, transistor 163 is turned off and transistor 164 is made conductive 60 that the content of bit 149 controls transistor 156. Subsequently, during normal circuit operation (after programming), transistor 165 is made conductive and transistors 164 and 163 are made nonconductive. This makes transistor 156 nonconductive. The signals srdsd and srdlo controlling transistors 164 and 165 are global signals that are coupled to every bit of every programming control shift register.

During test modes, it may be desirable to drive certain programming conductors with a first voltage and other programming conductors with a second voltage despite the fact that both the programming conductors are driven by programming drivers coupled to the same programming bus. Transistor 166 is therefore provided in the programming drivers. A digital low can be loaded into the bit 149. If transistors 164 and 166 are made conductive, then the digital low from bit 149 can be output onto the,programming conductor 158 despite the fact that programming bus 157 is supplied with another voltage (for example, programming voltage Vpp).

Figure 12:
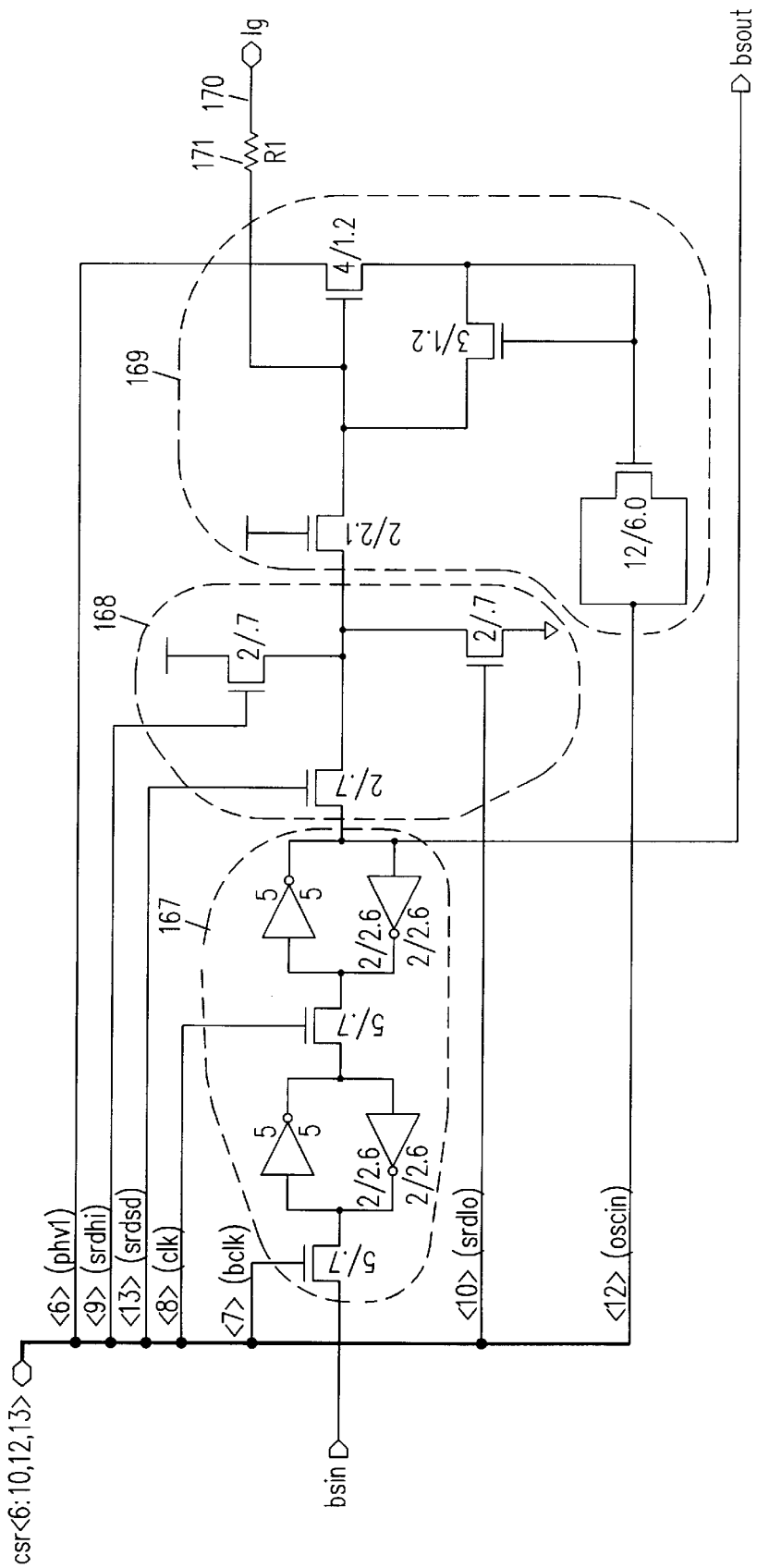
FIG. 12 is a diagram of a programming control driver.

FIG. 12 is a diagram of a programming control driver. Similar to the programming driver of FIG. 11A, the programming control driver of FIG. 12 includes a flip-flop bit 167, a test control circuit 168 and a charge pump 169. Rather than coupling a programming bus to a programming conductor via a transistor, the output of the charge pump of the programming control driver is coupled to a programming control conductor 170 via a 60/0.9 micron polysilicon resistor 171.

Figure 13:
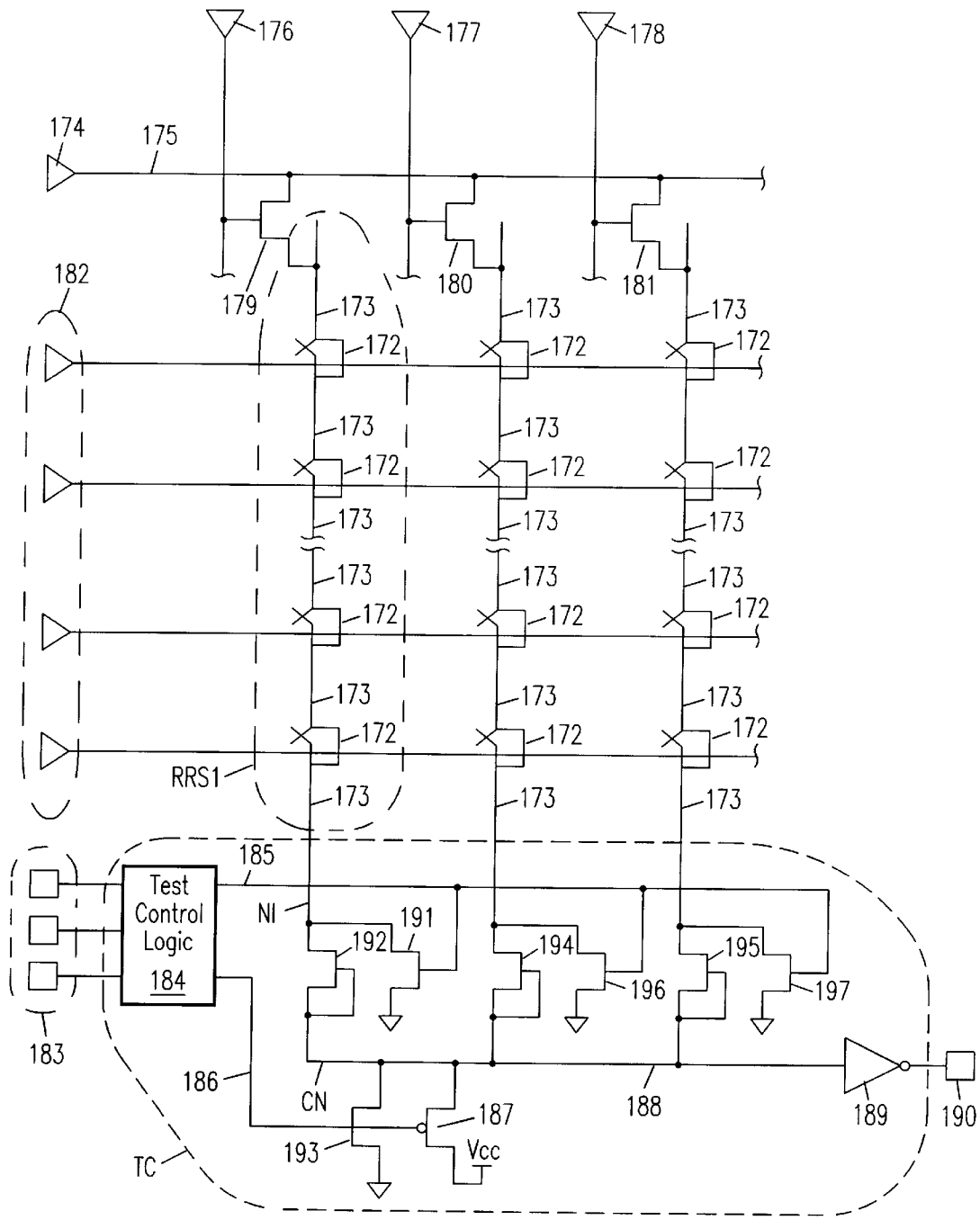
FIG. 13 is a simplified diagram illustrating a ninth aspect in accordance with the embodiment of FIG. 1 whereby a test circuit tests the integrity of collinearly extending routing wire segments in an unprogrammed programmable integrated circuit.

FIG. 13 is a simplified diagram illustrating a ninth aspect in accordance with the embodiment of FIG. 1. A test circuit TC is provided to test the integrity of collinearly extending routing wire segments in an unprogrammed field programmable gate array. Small test transistors 172 are placed electrically in parallel with the unprogrammed antifuses between adjacent collinearly extending routing wire segments 173. Programming driver 174 couples programming conductor 175 which extends adjacent a side of the integrated circuit to ground. Programming control drivers are 176–178 are controlled to keep programming transistors 179–181 nonconductive. Specially provided test control drivers 182 control the test transistors 172 to be conductive. In one embodiment, a unique combination of digital values is placed on a plurality of terminals 183 of the integrated circuit so that test control logic 184 drives conductor 185 low and conductor 186 low. As a result, small P-channel pull-up transistor 187 is made conductive and conductor 188 (common node CN) is weakly coupled to Vcc. Inverter 189 therefore drives an output terminal 190 of the integrated circuit to a digital low.

To test the left-most vertically extending routing resource structure RRS1 of collinearly extending routing wire segments, programming control driver 176 is controlled to output a digital high onto its associated programming control conductor, thereby making programming transistor 179 conductive and coupling grounded conductor 175 (through the vertically extending routing wire segments 173 and test transistors 172) to node N1 of test circuit TC. Because transistor 191 is nonconductive and a digital high voltage is on the gate of transistor 192, node N1 is coupled to common node CN. Because pull-up transistor 187 is small, the left-most routing resource structure can sink more current to ground than the small pull-up transistor 187 can source from Vcc. As a result, the voltage on common node CN falls and inverter 189 switches to output a digital high onto output terminal 190. If, for example, there were a break in one of the vertically extending routing wire segments in the first routing resource structure, then the voltage on common node CN would not be pulled down and the voltage on output terminal 190 would not switch to a digital high. Accordingly, such a problem with the integrity of the routing wire segments can be detected. This process of testing the integrity of routing wire segments is repeated routing resource structure by routing resource structure across the array of macrocells. In a exemplary embodiment, pull-up transistor 187 is 2 by 6 microns in size, test transistors 172 are 5 by 1.2 microns in size, transistors 192, 194 and 195 are 5 by 1.2 microns in size, and inverter 189 outputs a digital high when approximately 175 microamperes of current or more is sunk to ground through a routing resource structure in a test mode.

During normal circuit operation, test control logic 184 drives conductor 186 with a digital high, thereby turning transistor 193 on and turning transistors 192, 194 and 195 off. Conductor 185 is driven with a digital low thereby making transistors 191, 196 and 197 nonconductive. As a result, the test circuit TC is electrically isolated from the vertically extending routing wire segments during normal circuit operation.

To test the test circuit itself, conductor 186 is driven with a digital low such that transistor 187 is conductive. With a digital high present on common node CN inverter 189 drives output terminal 190 with a digital low. When a digital high is present on common node CN, transistors 192, 194 and 195 are conductive. Next, conductor 185 is driven with a digital high such that transistors 191, 196, and 197 are conductive. As the voltage on common node CN falls, transistors 192, 194 and 195 become less conductive but the voltage on common node CN falls sufficiently that inverter 189 switches and drives a digital high onto output terminal 190. If a digital high is not detected on output terminal 190, then a problem exists with the test circuit TC.

Test control logic 184 need not merely decode digital values on terminals 183 to drive conductors 185 and 186. In some embodiments, test control logic 184 may involve a state machine or other suitable logic for driving a sequence of signals onto the control conductors 185 and 186 of the test circuit so as to test the integrity of the collinearly extending routing wire segments. In the integrated circuit of FIG. 1, there are four such test circuits, two for testing vertically extending routing wire segments and two others for testing horizontally extending routing wire segments. The digital value output by the test circuit need not be directly supplied to an output terminal of the integrated circuit as is shown in FIG. 13, but rather the digital value can be supplied to other circuitry (such as, for example, a shift register bit) for shifting out of a terminal with other information. In a preferred embodiment, terminals 183 and 190 are available for use in the user-specific circuit operation and are coupled as shown in FIG. 13 only during the test mode.

Figure 14:
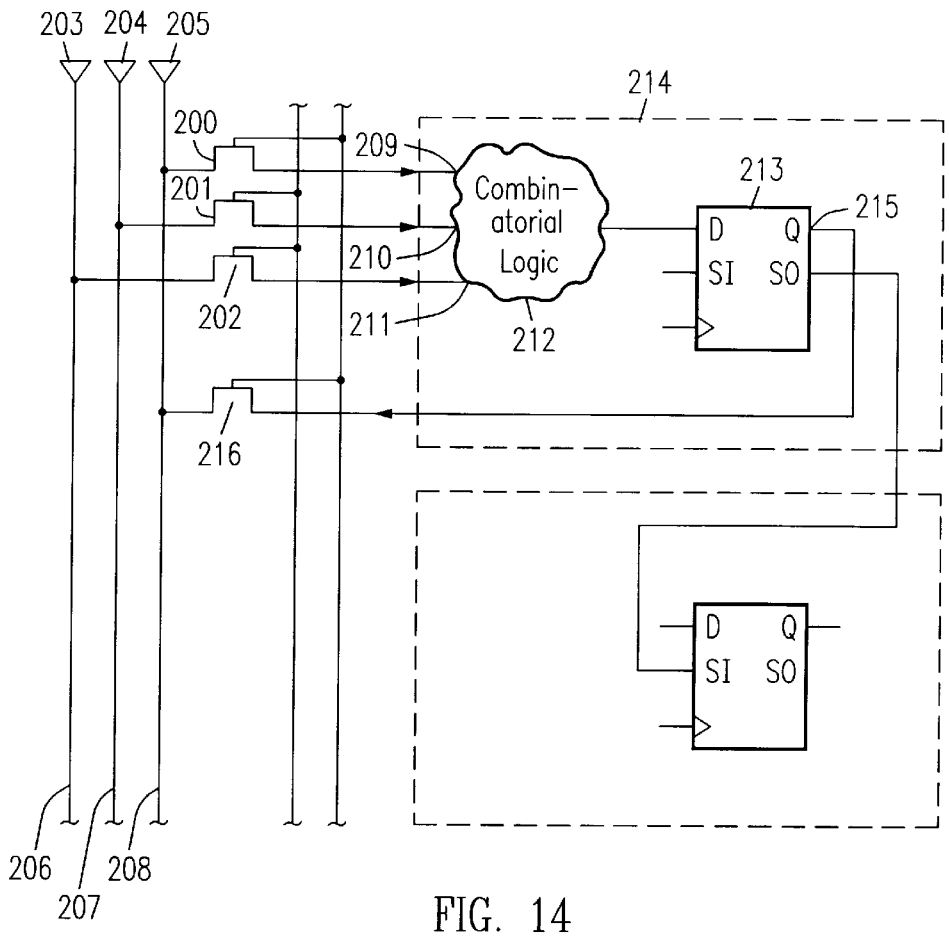
FIGS. 14–16 are simplified diagrams illustrating a tenth aspect in accordance with the embodiment of FIG. 1.
Figure 15:
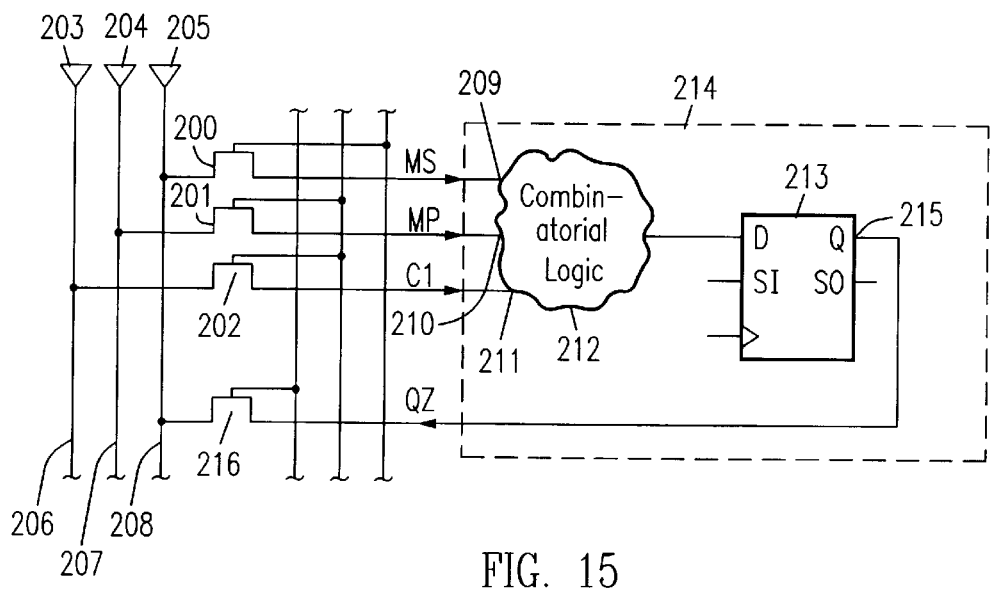
Figure 16:
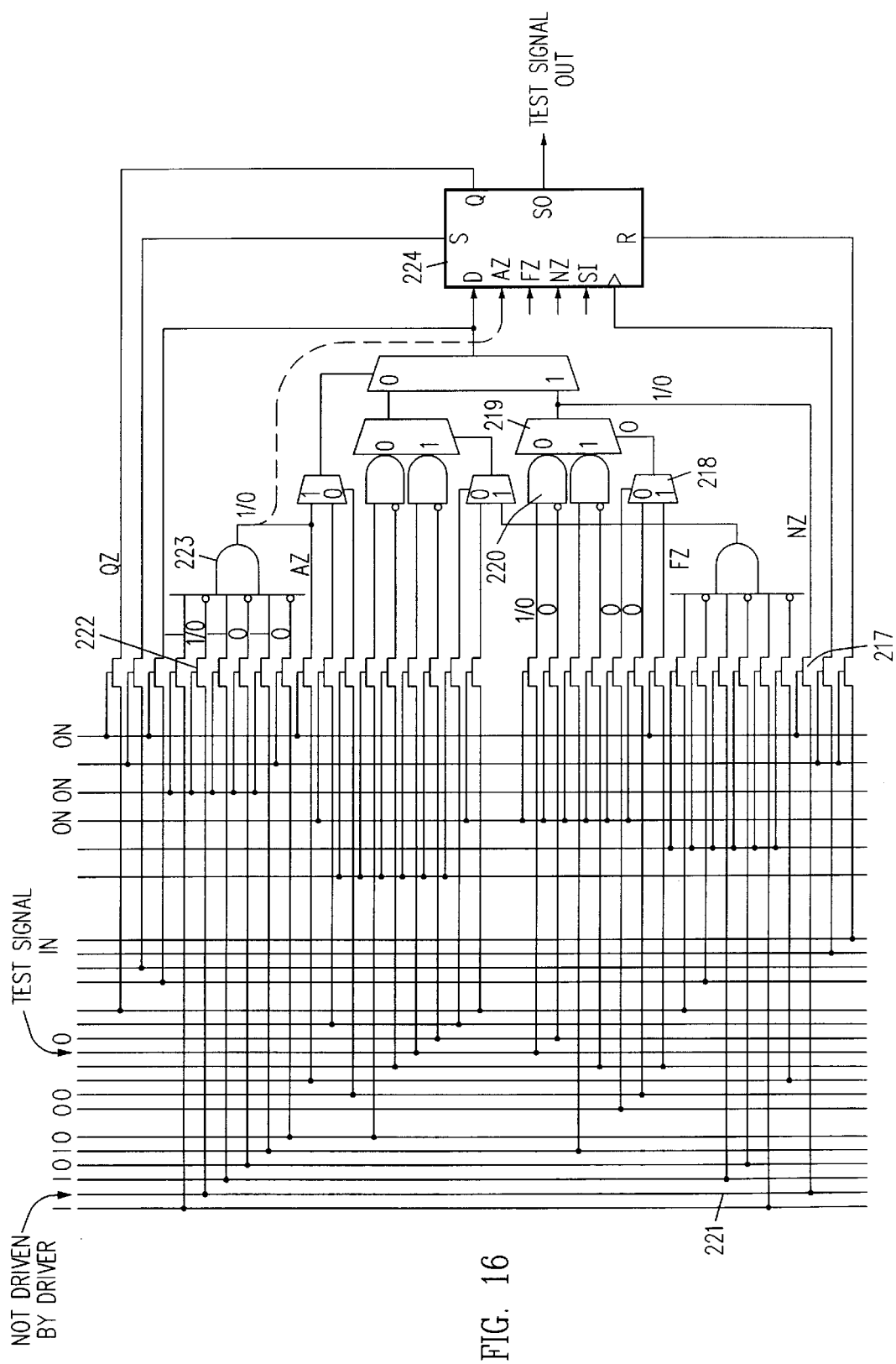

FIGS. 14–16 are simplified diagrams illustrating a tenth aspect in accordance with the embodiment of FIG. 1. It is desired to test the integrity of programming conductors, programming transistors, routing wire segments and a combinatorial portion of a logic module by driving a desired combination of digital values onto the inputs of the combinatorial portion. A defect is determined to exist if the correct digital value is not then output by the combinatorial portion. The digital value output by the combinatorial portion can be scan shifted out of the integrated circuit by capturing the digital value in the flip-flop of the logic module and scanning the captured digital value out of the integrated circuit in a scan out test mode. In the scan out test mode, the scan in input SI and the scan out SO output of the flip-flops of the logic modules are active so that the flip-flops are coupled together in a long scan chain, the scan out output SO of one flip-flop being connected to the scan in input SI of the next flip-flop. Accordingly, the digital values in all the flip-flops are scan shifted out of the integrated circuit and onto a terminal of the integrated circuit where the values are available for analysis.

A problem, however, exists if such a test were attempted on the structure of FIG. 14. Programming transistors 200, 201 and 202 would be made conductive so that desired digital values could be supplied via programming drivers 203, 204 and 205, programming conductors 206, 207 and 208, and programming transistors 200, 201 and 202 onto the inputs 209, 210, and 211 of the combinatorial portion 212. Next, the flip-flop 213 of the logic module 214 would be clocked to capture the output of the combinatorial portion for scanning out of the integrated circuit. The Q data output 215 of the flop-flop may, however, nevertheless be enabled and driving a digital value. Because the gates of programming transistors 200 and 216 are coupled together, the data output of flip-flop 213 would drive the programming conductor 208 which may conflict with the digital value driven by programming driver 205.

The structure of FIG. 15 solves this problem. The gate of no programming transistor coupled to an output of the logic module is coupled to the gate of any programming transistor coupled to an input of the logic module. In this example, the gate of output programming transistor 216 is not coupled to the gate of any of input programming transistors 200, 201 or 202.

FIG. 16 is a simplified diagram illustrating how the integrity of an output programming transistor 217 is tested in accordance with the embodiment of FIG. 1. It is desired to test such output programming transistors to make sure that the user will be able to program the FPGA in the field after shipment of the unprogrammed FPGA from the manufacturer. The horizontally extending routing wire segments are illustrated as being short to clarify the illustration. The "1" and "0" labels over conductors in FIG. 16 indicates the digital values driven onto the conductors. The "ON" over certain vertically extending programming control conductors indicates how the associated programming transistors are controlled.

Because the digital value supplied to the select input of multiplexer 218 is a digital 0 and the digital value on the 0 data input of multiplexer 218 is a digital 0, multiplexer 218 supplies a digital 0 to the select input of multiplexer 219. The digital 0 on the select input of multiplexer 219 causes the digital value on the 0 data input of multiplexer 219 to be output by multiplexer 219. Because the inverting input of AND gate 220 is driven with a digital 0 and the noninverting input is driven with the input test signal (denoted "1/0"), the test signal is output by multiplexer 219 as indicated by the "1/0" on the output lead of multiplexer 219. This test signal is therefore also present on the NZ output of the logic module and as shown can pass back to the left through a horizontally extending routing wire segment, through the output programming transistor 217 being tested, through vertically extending programming conductor 221 (which is not driven by a programming driver), and back into the logic module via input programming transistor 222 and an associated horizontally testing routing wire segment.

Because the noninverting inputs of AND gate 223 are driven with digital "1s" and because all the inverting inputs other than the second one are driven with digital "0s", the test signal (denoted "1/0") on the second inverting input of AND gate 223 is passed through AND gate 223 (denoted on the output of AND gate 223 as "1/0"). This signal is then captured in flop-flop 224 via flip-flop input AZ. (Flip-flop 224 has an input multiplexer which during testing can be controlled to couple one of nodes D, AZ, FZ, NZ and the scan input SO of another flip-flop onto an internal data input of the flip-flop.) After the test signal is captured in flip-flop 224 via input AZ, the test signal can be scan shifted out of the integrated circuit via the scan out output SO and a scan chain of similar logic module flip-flops.

Accordingly, the integrity of an output programming transistor (and input programming transistors) is tested by transmitting a test signal through the output programming transistor, supplying that test signal back to inputs of the logic module, and then capturing the test signal in the flip-flop of the logic module. Other output programming transistors of the macrocell containing the logic module are similarly tested. It is understood that the polarity of the test signal can change through a path and that the test signal is nonetheless a test signal indicative of the integrity of the signal path.

Figure 17:
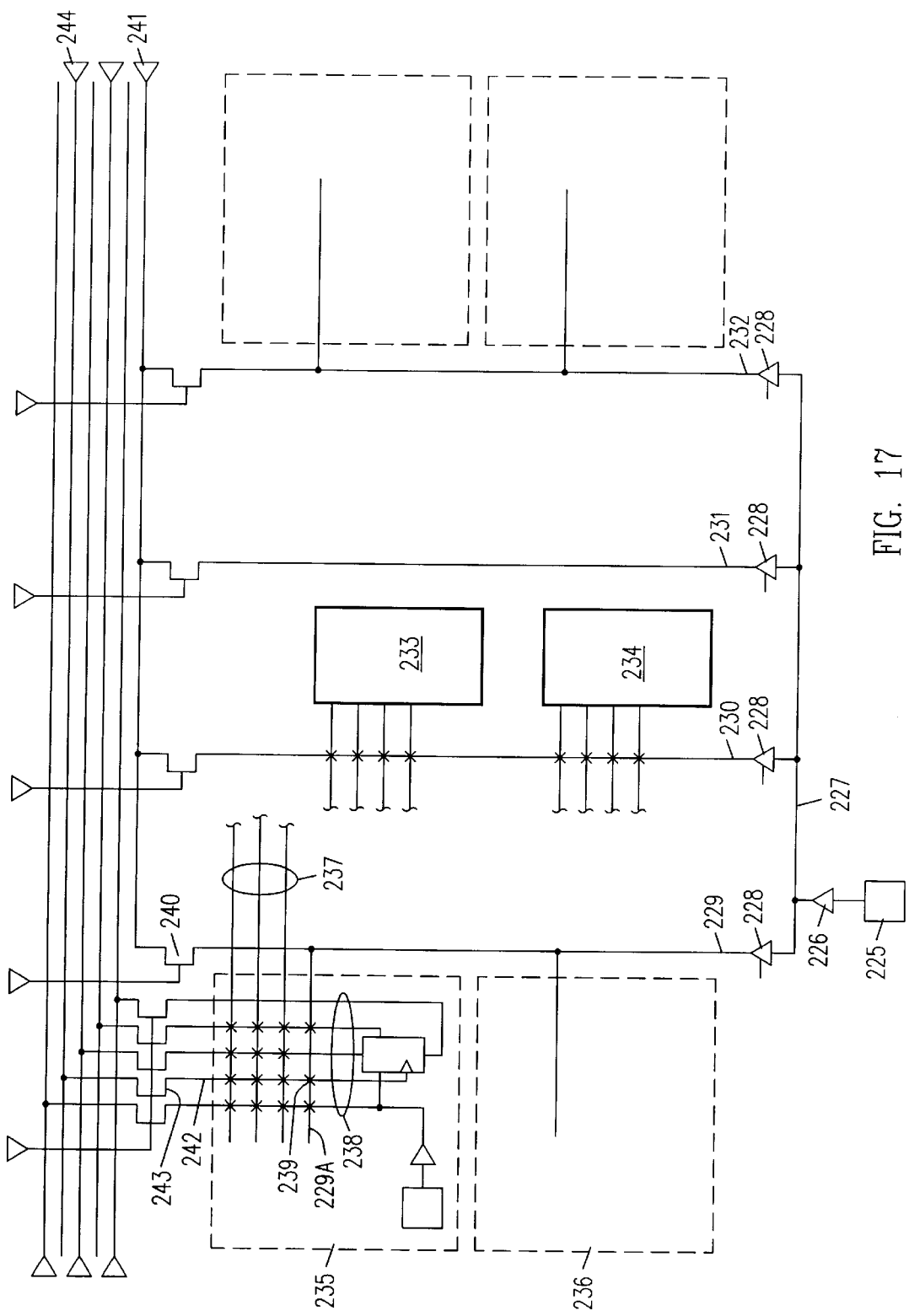
FIGS. 17 and 18 are simplified diagrams illustrating an eleventh aspect in accordance with the embodiment of FIG. 1.
Figure 18:
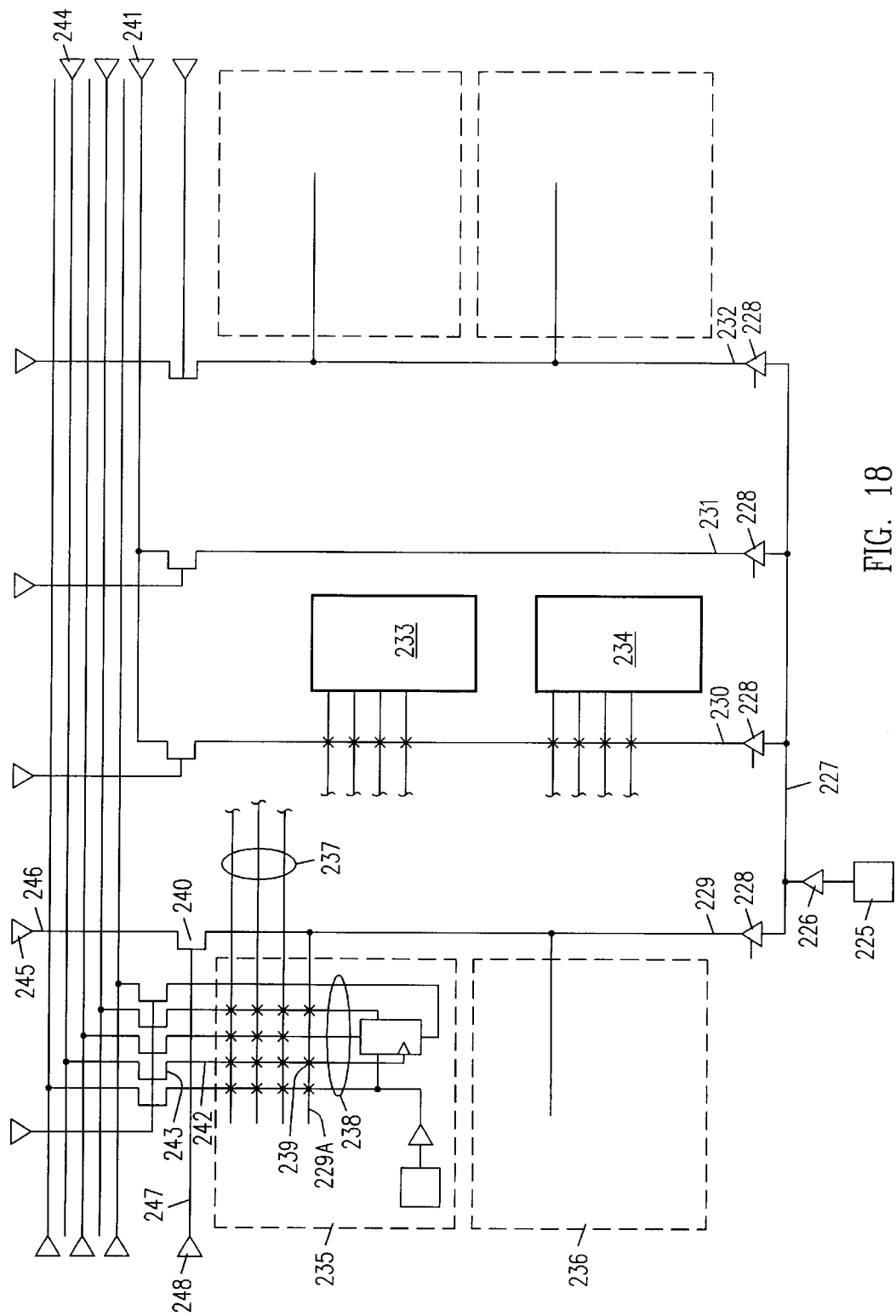

FIGS. 17 and 18 are simplified diagrams illustrating an eleventh aspect in accordance with the embodiment of FIG. 1. A global clock network comprises an input terminal 225, an input buffer 226, a horizontal routing conductor 227, buffers 228, and vertically extending routing conductors 229–232. Logic modules 233 and 234 represent two logic modules of one column of logic modules of an array of logic modules in the center of an integrated circuit chip. Routing conductor 229 extends in the vertical dimension between the leftmost column of logic modules and a column of interface cells 235 and 236 extending along the leftmost side of the integrated circuit. Horizontally extending routing wire segments 237 are disposed in a routing channel which passes between two adjacent rows of logic modules. Routing conductor 229 has a branch 229A that extends to the left and crosses the vertically extending routing wire segments 238 of the interface cell 235.

If it were desired to program antifuse 239, for example, then routing conductor 229 may be driven with the programming voltage via programming transistor 240 and a programming driver 241. Routing wire segment 242 then should be coupled to ground potential via programming transistor 243 and programming driver 244. Where the programming drivers illustrated on the upper right in FIG. 17 are all controlled by the same programming control shift register, however, such an architecture would not allow antifuse 239 to be programmed as discussed above. One programming driver controlled by a programming control shift register cannot be driving the programming voltage when another programming driver controlled by the same programming control shift register is driving ground potential.

In contrast to routing conductor 229, programming conductors 230 and 231 can be driven with appropriate voltages for antifuse programming. See FIG. 6 for an illustration of how a vertically extending conductor can be supplied with a programming voltage by a driver disposed adjacent the right side of an integrated circuit, the programming conductor extending in the horizontal dimension. Accordingly, programming driver 241 of FIG. 17 is properly situated and coupled to vertically extending rousing conductor 230.

FIG. 18 illustrates a structure which solves the problem with the structure of FIG. 17. A programming driver 245 which is controlled by a programming control shift register other than the programming control shift register controlling programming driver 241 is coupled to programming transistor 240 by a vertically extending programming conductor 246. The programming control shift registers can be arranged as illustrated and explained in connection with FIG. 9. Programming transistor 240 is controlled by a horizontally extending programming control conductor 247 and a programming control drive 248. To program antifuse 239, programming driver 245 can drive the programming voltage onto routing conductor 229 and programming driver 244 can cause routing wire segment 242 of interface cell 235 to be grounded. The two programming drivers are controlled by two different programming control shift registers. It is therefore seen that the programming driver locations for routing conductors 229 and 230 are different. The programming driver 245 for routing conductor 229 is adjacent the top side of the integrated circuit whereas the programming driver 241 for routing conductor 230 is adjacent the right side of the integrated circuit.

In some embodiments, input terminal 225 and input buffer 226 form a special input cell wherein a signal passing from the terminal 225 and onto routing conductor 229 does not have to pass through any antifuse. Input terminal 225 and input buffer 226 may be specially optimized to function as a dedicated clock input cell having a low propagation delay. Any suitable buffering scheme may be used. Buffers 228 are provided in the illustrated embodiment to buffer the clock signal and to isolate one routing conductor 229-232 from another during programming so that a cross antifuse on one routing conductor 229–232 can be programmed without inadvertently programming an antifuse on another of the routing conductors 229–232.

Although the present invention is described in connection with certain specific embodiments for instructional purposes, the present invention is not limited thereto. The terms horizontal and vertical, top and bottom, upper and lower, and left and right are relative to one another and are otherwise not limiting. The depictions of the various structures in the various diagrams is illustrative. Programming current can flow into and/or out of a programming voltage terminal or a ground terminal depending on the polarity of the programming voltage. Aspects of the present invention are not limited to amorphous silicon antifuses and oxide-nitride-oxide antifuses but rather extend to other antifuse structures. Accordingly, various modifications, adaptations, and combinations of various features of the described embodiments can be practiced without departing from the scope of the invention as set forth in the-following claims.

What is claimed is:

1. A programmable integrated circuit, comprising:
   a plurality of regions, each of the regions having a substantially identical structure, the structure comprising:
      a plurality of programming conductors, each of the programming conductors extending substantially parallel to one another in a first dimension;
      a plurality of wire segments, each of the wire segments extending substantially parallel to one another in a second dimension perpendicular to the first dimension;
      a plurality of programming transistors, each respective programming transistor having one electrode coupled to a corresponding respective one of the programming conductors and having another electrode coupled to a corresponding respective one of the wire segments;
      a plurality of antifuses, each respective antifuse being programmable to couple a respective wire segment in the structure to a corresponding respective wire segment in an adjacent one of the substantially identical structures, a wire segment and its corresponding wire segment in the adjacent substantially identical structure being substantially collinear with respect to one another;
      a plurality of control conductors, each control conductor extending in the second dimension, each respective one of the control conductors being coupled to gate electrodes of the programming transistors coupled to collinear wire segments;
   a first plurality of programming drivers coupled to selected ones of the programming conductors of one of the substantially identical structures B, all of the first plurality of programming drivers being disposed on one side of the control conductors of structure B; and
   a second plurality of programming drivers coupled to selected ones of the programming conductors of another of the substantially identical structures C, structure B being adjacent programming drivers being disposed on the opposite side of the control conductors of structure B from the first programming drivers, a programming conductor X in structure B being coupled to one of the first plurality of programming drivers but not being coupled to one of the second plurality of programming drivers, a programming conductor Y in the structure C corresponding with the programming conductor X in structure B being coupled to one of the second plurality of programming drivers but not being coupled to one of the first plurality of programming drivers.

2. The programmable integrated circuit of claim 1, wherein the programming conductors of structures B and C extend in a vertical dimension, and wherein the programming conductor X is the right-most programming conductor of structure B, and wherein the programming conductor Y is the right-most programming conductor of structure C.

3. The programmable integrated circuit of claim 1, wherein the first plurality of programming drivers is disposed substantially in a first row, the first row extending parallel to and adjacent a first side of the programmable integrated circuit, and wherein the second plurality of programming drivers is disposed substantially in a second row, the second row extending parallel to and adjacent a second side of the programmable integrated circuit.

4. The programmable integrated circuit of claim 1, wherein the programmable integrated circuit has a first programming voltage input terminal, a second programming voltage input terminal, and a ground terminal, the programmable integrated circuit further comprising:
   a programming current multiplexer having a first input lead coupled to the first programming voltage input terminal, a second input lead coupled to the second programming voltage input terminal, and an output lead coupled to each of the first plurality of programming drivers.

* * * * *